United States Patent
Takahata

(10) Patent No.: US 12,204,251 B2
(45) Date of Patent: Jan. 21, 2025

(54) PATTERN GENERATION METHOD, TEMPLATE, AND METHOD FOR MANUFACTURING TEMPLATE

(71) Applicant: Kioxia Corporation, Tokyo (JP)

(72) Inventor: Kazuhiro Takahata, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 574 days.

(21) Appl. No.: 17/472,334

(22) Filed: Sep. 10, 2021

(65) Prior Publication Data

US 2022/0308456 A1    Sep. 29, 2022

(30) Foreign Application Priority Data

Mar. 23, 2021 (JP) ................. 2021-048272

(51) Int. Cl.
| | |
|---|---|
| H01L 21/768 | (2006.01) |
| G03F 3/00 | (2006.01) |
| G03F 7/00 | (2006.01) |
| G06F 30/10 | (2020.01) |
| G06F 30/20 | (2020.01) |

(52) U.S. Cl.
CPC .............. *G03F 7/705* (2013.01); *G06F 30/10* (2020.01); *G06F 30/20* (2020.01)

(58) Field of Classification Search
CPC ........ G03F 7/705; G03F 7/0002; G06F 30/10; G06F 30/20; H01L 21/76817
See application file for complete search history.

(56) References Cited

U.S. PATENT DOCUMENTS

| | | | |
|---|---|---|---|
| 7,928,004 B2 | 4/2011 | Seidel et al. | |
| 8,466,068 B2 | 6/2013 | Scheuerlein | |
| 8,468,480 B2* | 6/2013 | Inanami | G06F 30/398 |
| | | | 716/110 |
| 10,031,414 B2 | 7/2018 | Isobayashi | |
| 2006/0230959 A1* | 10/2006 | Meijer | B82Y 40/00 |
| | | | 101/368 |
| 2010/0215909 A1 | 8/2010 | MacDonald | |

(Continued)

FOREIGN PATENT DOCUMENTS

| | | |
|---|---|---|
| JP | 2009-523312 A | 6/2009 |
| JP | 2009-543334 A | 12/2009 |

(Continued)

*Primary Examiner* — Nghia M Doan
(74) *Attorney, Agent, or Firm* — Finnegan, Henderson, Farabow, Garrett & Dunner, LLP

(57) ABSTRACT

A design pattern generation method of an embodiment is a method for generating a design pattern of a template. The design pattern generation method includes: generating an actual pattern including a first pattern protruding from a contact surface of the template with a material layer and extending in a predetermined direction along the contact surface, and a second pattern further protruding from an upper surface of the first pattern; calculating a volume of the first pattern and the second pattern per unit area on the contact surface; and adding, when a difference in the volume of the first pattern and the second pattern per unit area between regions on the contact surface exceeds a specified value, a third pattern to a region where the volume of the first pattern and the second pattern per unit area is small.

7 Claims, 16 Drawing Sheets

(56) References Cited

U.S. PATENT DOCUMENTS

2011/0309548 A1* 12/2011 Aihara .................. B82Y 40/00
  264/293
2016/0033818 A1* 2/2016 Lee ..................... G02F 1/13336
  359/485.05

FOREIGN PATENT DOCUMENTS

| JP | 2011-508459 A | 3/2011 |
| JP | 2014-179548 A | 9/2014 |
| JP | 2016-4840 A | 1/2016 |

\* cited by examiner

| DENSITY OF LINE/COLUMNAR PORTIONS | DENSE ⟷ SPARSE |
| --- | --- |
| DENSITY OF DUMMY PORTION | SPARSE ⟷ DENSE |
| HEIGHT OF DUMMY PORTION | LOW ⟷ HIGH |
| AREA OF DUMMY PORTION | SMALL ⟷ LARGE |
| NUMBER OF DUMMY PORTIONS | SMALL ⟷ LARGE |

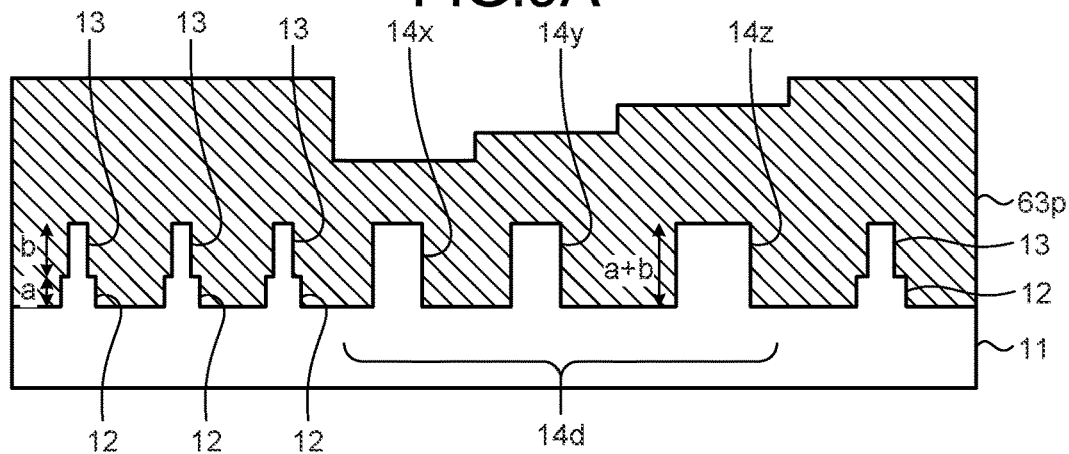
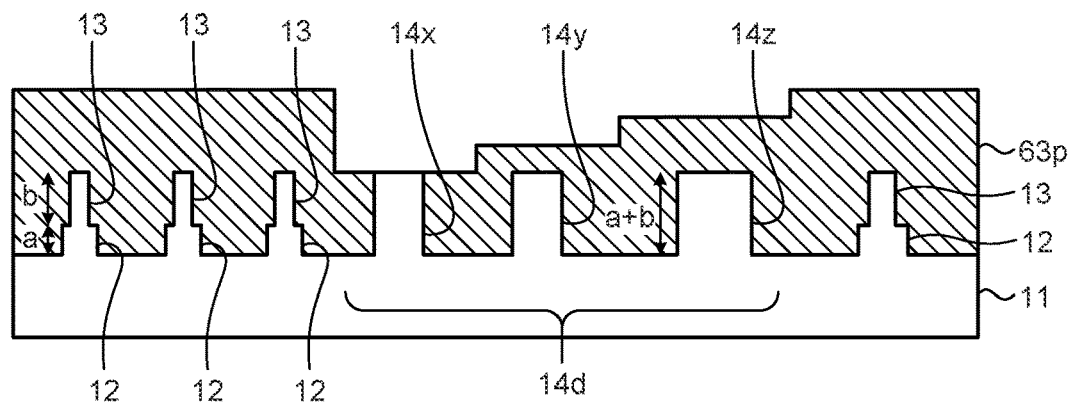
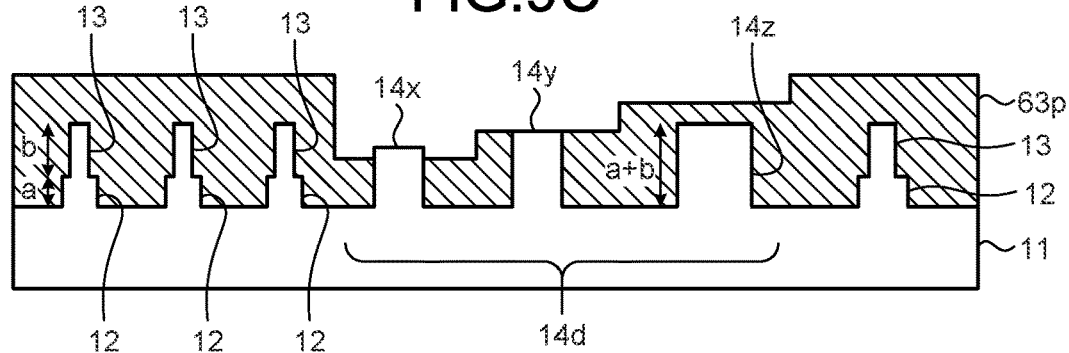
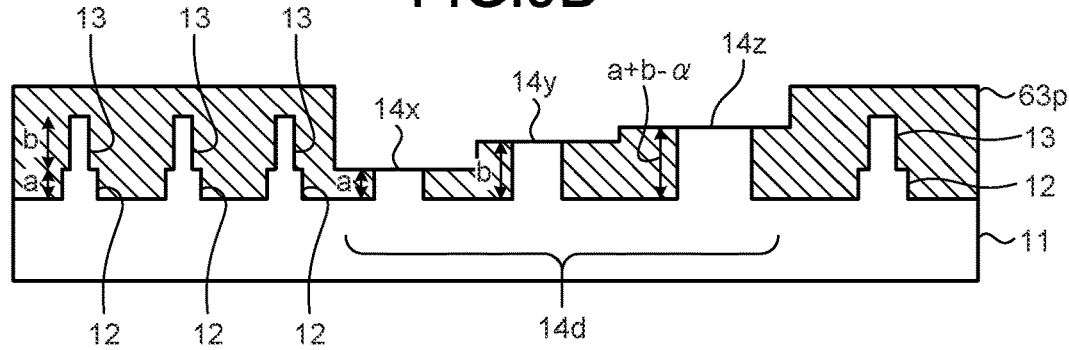

PATTERN GENERATION METHOD, TEMPLATE, AND METHOD FOR MANUFACTURING TEMPLATE

CROSS-REFERENCE TO RELATED APPLICATIONS

This application is based upon and claims the benefit of priority from Japanese Patent Application No. 2021-048272, filed on Mar. 23, 2021; the entire contents of which are incorporated herein by reference.

FIELD

Embodiments described herein relate generally to a design pattern generation method, a template, a method for manufacturing a template, and a semiconductor device.

BACKGROUND

A process of manufacturing a semiconductor device may include an imprint process. In the imprint process, for example, a template is pressed against an organic material applied onto a substrate, and a pattern of the template is transferred. At this time, a dummy pattern may be used in order to correct a difference in density on a transfer surface of the pattern transferred to the organic material.

However, merely correcting the difference in density on the transfer surface may cause variations in residual film thickness of a transferred pattern bottom.

BRIEF DESCRIPTION OF THE DRAWINGS

FIGS. 9A to 9D are cross-sectional views illustrating an example of the procedure of the method for manufacturing a template according to the embodiment;

DETAILED DESCRIPTION

Figure 1A:
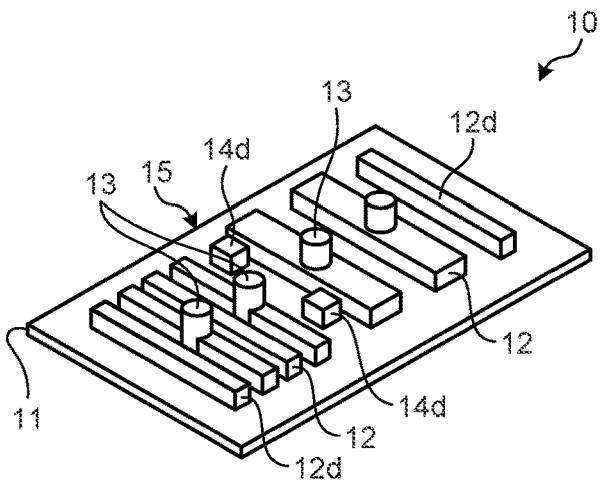
FIGS. 1A to 1E are schematic diagrams illustrating an outline of a flow of forming wiring and a via by a dual damascene method using an imprint process according to an embodiment.

A design pattern generation method of an embodiment is a method for generating a design pattern of a template, the design pattern generation method including: generating an actual pattern including a first pattern protruding from a contact surface of the template with a material layer and extending in a predetermined direction along the contact surface, and a second pattern further protruding from an upper surface of the first pattern; calculating a volume of the first pattern and the second pattern per unit area on the contact surface; and adding, when a difference in the volume of the first pattern and the second pattern per the unit area between regions on the contact surface exceeds a specified value, a third pattern to a region where the volume of the first pattern and the second pattern per the unit area is small.

Hereinafter, the present invention will be described in detail with reference to the drawings. Note that the present invention is not limited to the following embodiment. In addition, constituent elements in the following embodiment include those that can be easily assumed by a person skilled in the art or those that are substantially the same.

(Flow of Forming Dual Damascene Structure)

In a process of manufacturing a semiconductor device, a dual damascene method may be used for forming a via and wiring. In the dual damascene method, an insulating film such as an $SiO_2$ film is dug to form a hole and a trench formed on the hole, and the hole and the trench are filled with a conductive material to collectively form a via and wiring connected to the via. At this time, a conductive film covering the entire insulating film is formed, and the conductive film is polished and removed from the insulating film by a chemical mechanical polishing (CMP) method or the like. As a result, the conductive material remains in the hole and the trench, and the via and the wiring are formed.

When the conductive film is polished using the CMP method or the like, the insulating film in a region where wiring is not formed is selectively polished at an interface between the conductive film and the insulating film, and the insulating film in the region and wiring or the like adjacent to the region may be recessed to form a dishing shape. Therefore, in order to suppress selective polishing of the insulating film, a dummy pattern may be arranged on the insulating film in a region where no wiring is formed. The dummy pattern is in an electrically floating state, not connected to the via, the wiring, and the like, and does not contribute to the function of the semiconductor device.

In the semiconductor device of the embodiment, the dual damascene structure including a via and wiring connected to the via is formed using an imprint method. An outline thereof is illustrated in FIGS. 1A to 1E.

FIGS. 1A to 1E are schematic diagrams illustrating an outline of a flow of forming wiring 42 and a via 43 by a dual damascene method using an imprint process according to the embodiment. Note that the drawings illustrated in FIGS. 1A to 1E are simplified, and do not necessarily illustrate each configuration accurately.

As illustrated in FIG. 1A, a template 10 includes a substrate 11 made of a transparent material such as quartz, a protruding pattern 15 including a line portion 12 and a columnar portion 13, and protruding dummy portions 12d and 14d. The columnar portion 13 is arranged at a position overlapping with the line portion 12. The dummy portions 12d and 14d are arranged at positions not overlapping with the line portion 12 and the columnar portion 13.

Figure 1C:
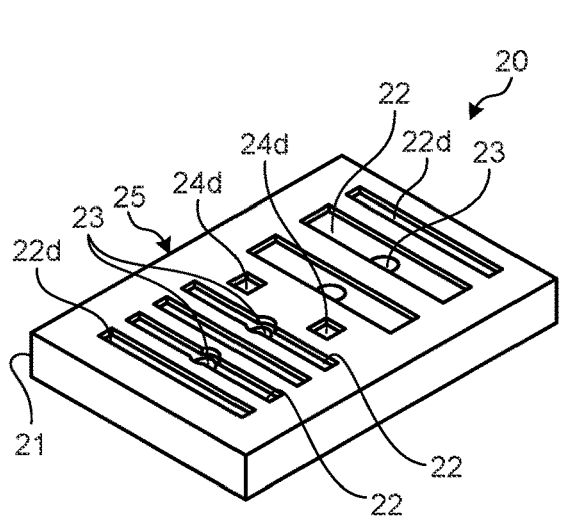
Figure 1B:
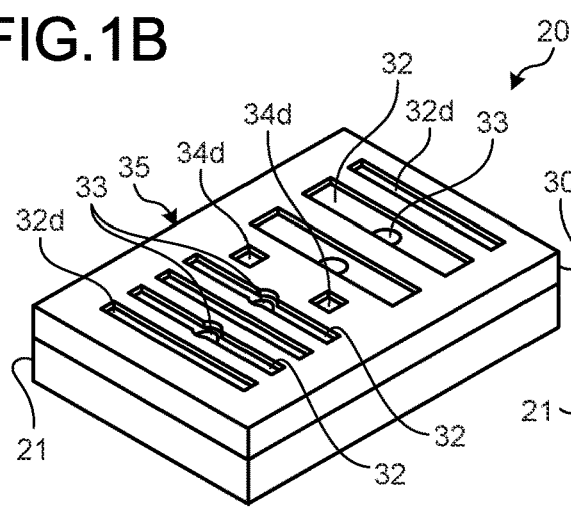

As illustrated in FIG. 1B, a semiconductor device 20 in the middle of manufacturing includes a workpiece film 21. The workpiece film 21 is an insulating film such as an $SiO_2$ film to which the protruding pattern 15 of the template 10 is transferred. A resist film 30 is formed on the workpiece film 21.

The protruding pattern 15 and the dummy portions 12d and 14d of the template 10 are pressed against the resist film 30. As a result, on the resist film 30, a recessed pattern 35 including a wiring pattern 32 and a via pattern 33 arranged at a position overlapping with the wiring pattern 32 and recessed dummy patterns 32d and 34d are formed. Then, the workpiece film 21 of the semiconductor device 20 is processed according to the recessed pattern 35 of the resist film 30.

As illustrated in FIG. 1C, the recessed pattern 35 and the dummy patterns 32d and 34d of the resist film 30 are transferred. As a result, a recessed pattern 25 including the wiring pattern 22 and the via pattern 23 arranged at a position overlapping with the wiring pattern 22 and the recessed dummy patterns 22d and 24d are formed in the workpiece film 21.

Figure 1D:
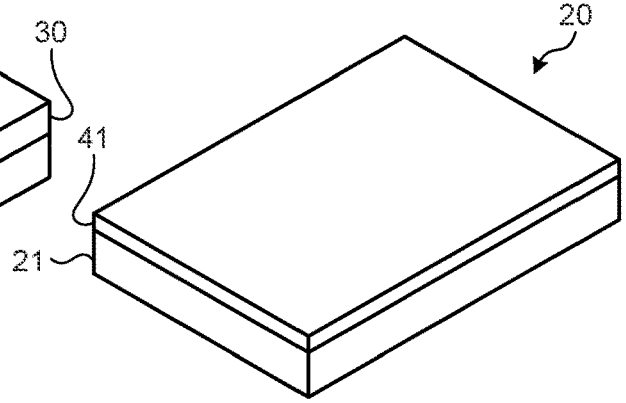

As illustrated in FIG. 1D, a conductive film 41 covering the recessed pattern 25 and the dummy patterns 22d and 24d is formed on the workpiece film 21. As a result, the recessed pattern 25 and the dummy patterns 22d and 24d are filled with a conductive material.

Figure 1E:
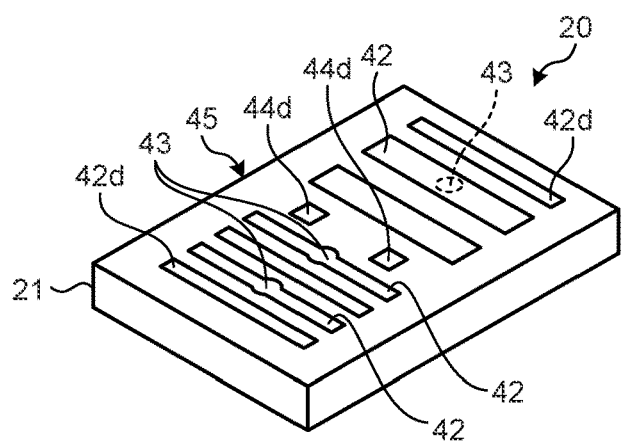

As illustrated in FIG. 1E, the conductive film 41 on the workpiece film 21 is removed by CMP or the like. As a result, a dual damascene structure 45 including the wiring 42 in which the wiring pattern 22 is filled with the conductive material and the via 43 in which the via pattern 23 is filled with the conductive material, and dummies 42d and 44d in which the dummy patterns 22d and 24d are filled with the conductive material are formed in the workpiece film 21.

When the conductive film 41 on the workpiece film 21 is removed by CMP or the like, the dummy patterns 22d and 24d are arranged in a region of the workpiece film 21 where the wiring pattern 22 and the via pattern 23 are not formed. Therefore, formation of the workpiece film 21 in the region, the wiring 42 adjacent to the region, or the like into a dishing shape is suppressed.

(Configuration Example of Design Pattern Generation Device)

Figure 2:
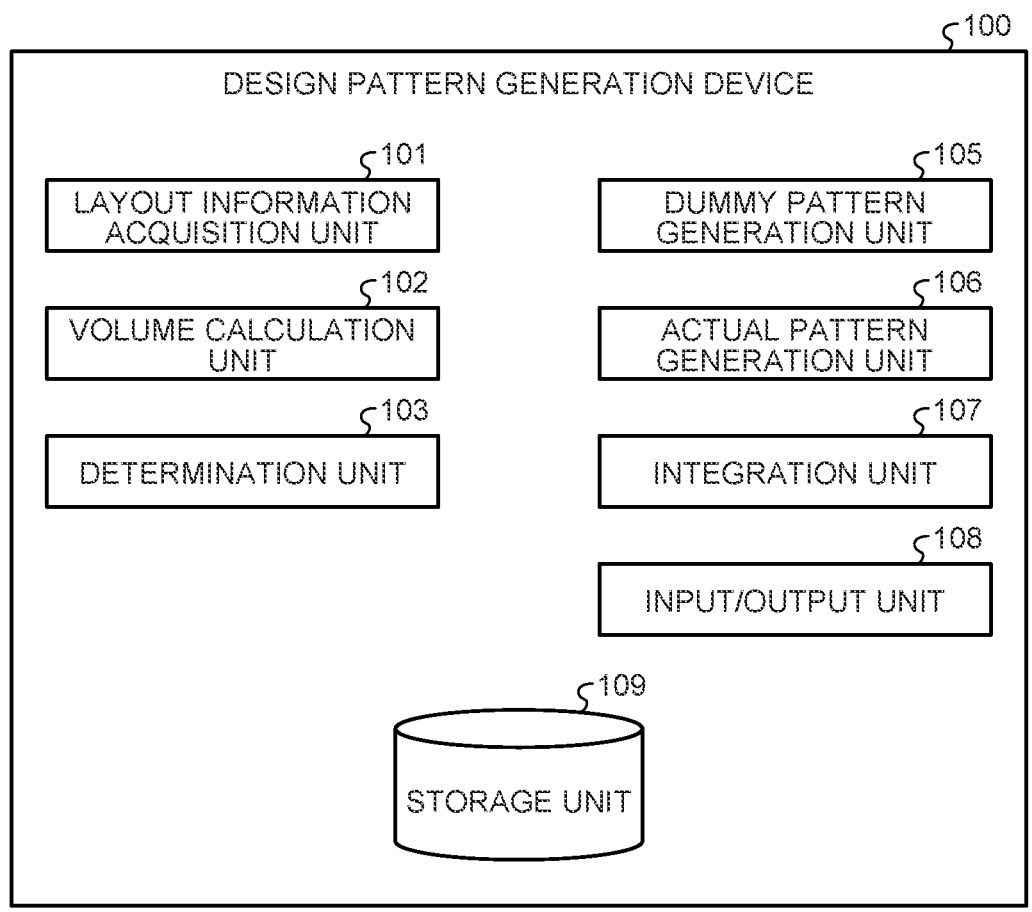
FIG. 2 is a block diagram illustrating an example of a configuration of a design pattern generation device according to the embodiment.

Next, a configuration example of a design pattern generation device 100 of the embodiment will be described with reference to FIG. 2. FIG. 2 is a block diagram illustrating an example of a configuration of the design pattern generation device 100 according to the embodiment.

The design pattern generation device 100 of the embodiment generates a design pattern of a template that transfers various patterns, for example, based on information on various patterns transferred to a resist film of the semiconductor device. When the template is manufactured, various shapes are formed in the template based on the design pattern. When generating the design pattern, the design pattern generation device 100 appropriately adds a dummy pattern to the design pattern as necessary.

The design pattern generation device 100 is configured as a computer including, for example, a central processing unit (CPU), a read only memory (ROM), and a random access memory (RAM). The design pattern generation device 100 may include a storage device such as a hard disk drive (HDD) that stores various types of information. The CPU of the design pattern generation device 100 develops a program stored in the ROM or the like in the RAM and executes the program, thereby implementing various functional units described below. However, each of the functional units is merely an example.

As illustrated in FIG. 2, the design pattern generation device 100 includes, as functional units, a layout information acquisition unit 101, a volume calculation unit 102, a determination unit 103, a dummy pattern generation unit 105, an actual pattern generation unit 106, an integration unit 107, an input/output unit 108, and a storage unit 109.

The layout information acquisition unit 101 acquires layout information from, for example, a designing device that designs layouts of various configurations of the semiconductor device. The layout information includes, for example, information on layouts of various patterns to be transferred to a resist film.

As in the above-described example of FIGS. 1A to 1E, for example, in order to form the dual damascene structure 45 in the semiconductor device 20, when a design pattern of the template 10 that transfers the recessed pattern 35 to the resist film 30 is generated, the layout information includes information such as the number, arrangement, widths, and depths of the wiring patterns 32 and information such as the number, arrangement, diameters, and depths of the via patterns 33.

The volume calculation unit 102 calculates volumes of various patterns included in an actual pattern from actual pattern information generated by the actual pattern generation unit 106 described later based on the layout information. In a case of an actual pattern related to the above-described template 10, the actual pattern includes a line pattern to be the line portion 12 and a columnar pattern to be the columnar portion 13. The volume calculation unit 102 calculates the volume of the line pattern from, for example, the number ($N_L$), widths ($W_L$), lengths ($L_L$), and heights ($H_L$) of the line patterns. More specifically, the volume of the line pattern may be calculated using the following formula ($W_L*L_L*H_L$) $*N_L$. In addition, the volume calculation unit 102 calculates the volume of the columnar pattern from the number (Nc), diameters (Dc), and heights (Hc) of the columnar patterns. In case a circular cross-sectional shape of the columnar patterns is circular, the volume of the columnar pattern may be calculated using the following formula [(Dc/2*Dc/2*π*Hc]*Nc.

At this time, the volume calculation unit 102 calculates the volume of the line pattern and the columnar pattern per unit area on a contact surface of the template 10 with the resist film.

Specifically, for example, the volume calculation unit 102 may divide a shot region included in the semiconductor device into a grid shape, and may divide the contact surface of the template into unit areas by making the grid shape correspond to the contact surface of the template. The shot region is a region to which a pattern is transferred when the template is pressed against the resist film once. Alternatively, the volume calculation unit 102 may determine a region where the density of the pattern is high and a region where the density of the pattern is low based on the calculated volumes of various patterns, and may define each of the regions as a unit area. Each of these regions may be divided into smaller unit areas.

In the case of the actual pattern related to the above-described template 10, the volume of the line pattern and the columnar pattern that varies depending on a unit area is calculated according to an arrangement of the line pattern and an arrangement of the columnar pattern.

The determination unit 103 compares the calculated volume of the actual pattern among unit areas. In addition, the determination unit 103 determines whether or not a difference in the volume of the actual pattern per unit area between regions on the contact surface of the template exceeds a specified value.

When it is determined that the difference in the volume of the actual pattern per unit area exceeds a specified value, the dummy pattern generation unit 105 determines to add a dummy pattern to a region where the volume of the actual pattern per unit area is large.

When adding the dummy pattern, the dummy pattern generation unit 105 calculates the density of the dummy pattern to be added. In addition, the dummy pattern generation unit 105 determines the number, arrangement, areas, heights, and the like of dummy patterns to be added from the calculated density.

In addition, the dummy pattern generation unit 105 generates dummy pattern information including information such as the number, arrangement, areas, and heights of the determined dummy patterns.

In this flow, by adding the dummy pattern to the design pattern, a shape corresponding to the dummy pattern is also formed in the actual template in addition to a shape corresponding to the actual pattern. For example, in the above-described example of FIGS. 1A to 1E, the dummy portions 12d and 14d are added to the template 10 based on a calculation result of the dummy pattern generation unit 105. Furthermore, in the resist film 30, the dummy pattern 32d is transferred to an outer region of the wiring pattern 32, and the dummy pattern 34d is transferred to a region between the wiring patterns 32.

The actual pattern generation unit 106 generates actual pattern information based on the acquired layout information. While the dummy pattern is a pattern that does not contribute to the function of the semiconductor device, the actual pattern is a wiring, a via, or the like that contributes to the function of the semiconductor device. The actual pattern information includes information on the pattern to be wiring, a via, or the like.

In the case of the above-described template 10, the actual pattern generation unit 106 generates actual pattern information including information on the line pattern and the columnar pattern. Based on the actual pattern information, the line portion 12 to be the wiring 42 of the semiconductor device 20 and the columnar portion 13 to be the via 43 of the semiconductor device 20 are formed in the template 10.

In addition, when the determination unit 103 determines that the difference in the volume of the actual pattern per unit area exceeds a specified value, the actual pattern generation unit 106 reduces the volume of the actual pattern arranged in a region where the volume per unit area is small.

Specifically, for example, the actual pattern generation unit 106 reduces at least one of the widths, diameters, heights, and the like of various patterns included in the actual pattern, and regenerates an actual pattern in which the volumes of the various patterns are reduced. That is, the actual pattern generation unit 106 corrects the actual pattern based on the layout information acquired by the above-described layout information acquisition unit 101. In addition, the actual pattern generation unit 106 generates actual pattern information including the regenerated actual pattern.

In the case of the above-described template 10, the actual pattern generation unit 106 reduces the volume of at least one of the line pattern and the columnar pattern. When the volume of the line pattern is reduced, for example, the line pattern can be lowered. That is, the line pattern can be thinned. When the volume of the columnar pattern is reduced, for example, the diameter of the columnar pattern can be reduced. That is, the columnar pattern can be thinned.

However, in the total volume of the line pattern and the columnar pattern, the ratio of the volume of the line pattern is considerably large, and for example, it is easy to effectively reduce the total volume by lowering the line pattern. Therefore, when reducing the volume of the actual pattern, the actual pattern generation unit 106 may reduce the volume of the line pattern in preference to the volume of the columnar pattern.

The integration unit 107 integrates the dummy pattern information generated by the dummy pattern generation unit 105 and the actual pattern information generated or corrected based on the layout information by the actual pattern generation unit 106 to generate design pattern information including information on the design pattern of the template. In addition, when the dummy pattern generation unit 105 does not generate the dummy pattern information, the integration unit 107 sets the actual pattern information generated by the actual pattern generation unit 106 as the design pattern information.

The input/output unit 108 receives an input from a user to the design pattern generation device 100, such as an instruction to generate design pattern information. In addition, the input/output unit 108 outputs the generated design pattern information and the like in accordance with, for example, an instruction from a user.

The storage unit 109 stores various types of information. Examples of the various types of information include layout information on various patterns acquired from the above-described designing device, dummy pattern information generated by the dummy pattern generation unit 105, actual pattern information before and after correction generated by the actual pattern generation unit 106, and design pattern information generated by the integration unit 107.

(Concept of Design Pattern Generation)

Next, a method for generating a design pattern will be described with reference to FIGS. 3A to 4B. FIGS. 3A to 4B are conceptual diagrams of a design pattern generation method according to the embodiment. In the following description, the design pattern generation method will be conceptually described.

Figure 3A:
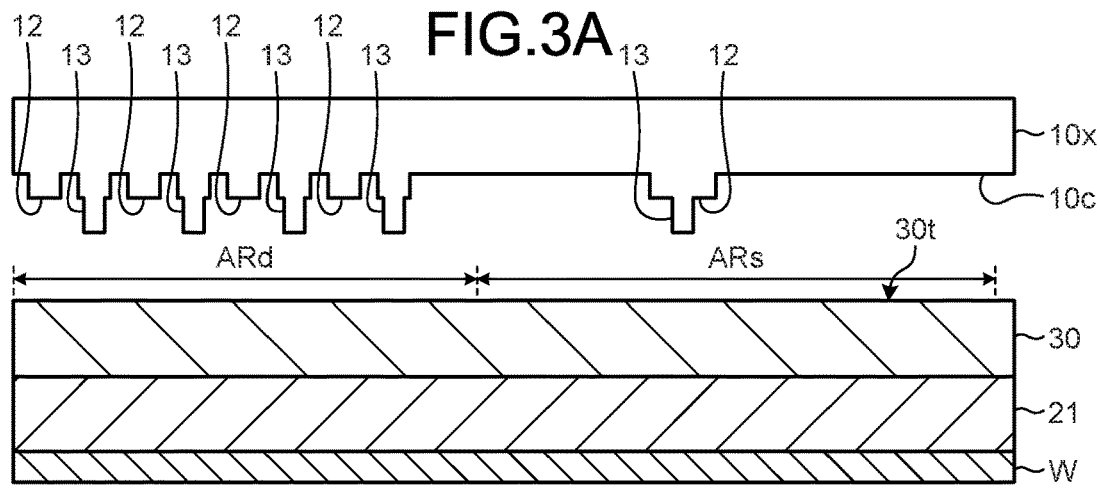
FIGS. 3A to 3D are conceptual diagrams of a design pattern generation method according to the embodiment.
Figure 3B:
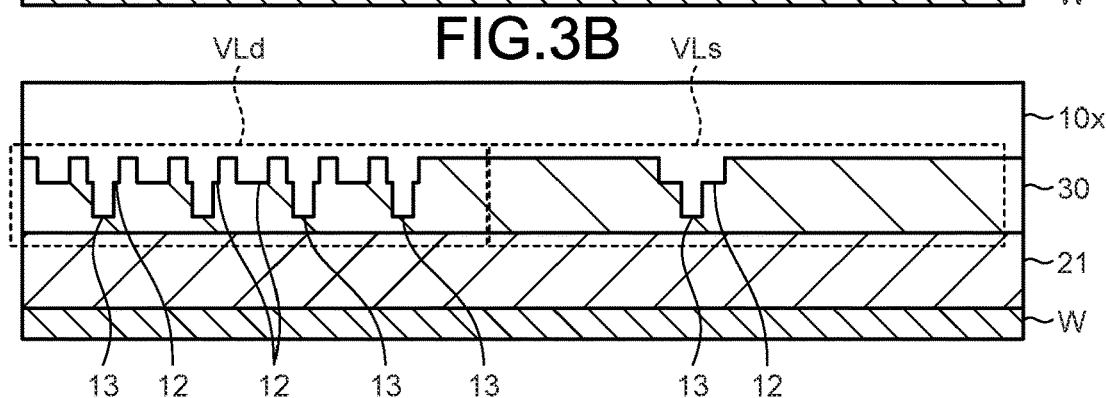

As illustrated in FIGS. 3A and 3B, in generating a design pattern, first, a case where only an actual pattern is transferred to the resist film 30 is considered.

FIG. 3A is a cross-sectional view illustrating a state in which a pattern of a virtual template 10x having only an actual pattern is transferred to the resist film 30 applied on a wafer W.

The wafer W as a first substrate is a semiconductor wafer such as a silicon wafer, an insulator wafer such as a ceramic wafer, a conductor wafer such as a diamond wafer, or the like. The workpiece film 21 is formed on the wafer W, and the resist film 30 is formed on the workpiece film 21. Note that here, not only the single wafer W but the entire wafer W including the workpiece film 21 and the like may also be referred to as the first substrate. When another film or a structure constituting a part of the semiconductor device 20 such as a transistor is interposed between the workpiece film 21 and the wafer W, and when another film such as a spin on carbon (SOC) film or a spin on glass (SOG) film is interposed between the resist film 30 and the workpiece film 21, the entire wafer W including these films may also be referred to as the first substrate.

As described above, when the dual damascene structure 45 (see FIG. 1E) is formed, an insulating film such as a $SiO_2$ film can be used as the workpiece film 21. The workpiece film 21 may have a configuration in which a plurality of types of insulating films is stacked.

The resist film 30 is a film in which an organic material such as a resist material is applied onto the workpiece film 21 by, for example, a spin coating method. The spin-coated resist film 30 has a substantially uniform film thickness over the entire region.

When a pattern is transferred to the resist film 30 by an imprint process, it is preferable to use a material such as a photocurable resist or a thermosetting resist as the organic material. However, an organic material other than the resist material can also be used as long as the material functions as a mask for the workpiece film 21 when the workpiece film 21 is etched.

The virtual template 10x includes the line portion 12 and the columnar portion 13 as an actual pattern. The line portion 12 and the columnar portion 13 are formed with reference to actual pattern information generated based on the layout information acquired from the above-described designing device.

Note that in the example of FIG. 3A, the template 10x has a region in which a large number of line portions 12 and columnar portions 13 are arranged and a region in which a small number of line portions 12 and columnar portions 13 are arranged.

When these actual patterns are transferred to the resist film 30, the template 10x is arranged with respect to the wafer W such that a surface on which the line portion 12 and the columnar portion 13 are formed faces the resist film 30.

In addition, as described later, in order to transfer the line portion 12 and the columnar portion 13, when the template 10x is pressed against the resist film 30, the template 10x and the wafer W are brought close to each other such that the line portion 12 and the columnar portion 13 are buried in the resist film 30 up to base portions thereof. At this time, a surface of the template 10x in contact with a surface of the resist film 30 is referred to as a contact surface 10c of the template 10x. In addition, a surface of the resist film 30 to which the actual pattern of the template 10x is transferred is referred to as a transfer surface 30t of the resist film 30.

As described above, the contact surface 10c of the template 10x has a dense surface in which a large number of line portions 12 are arranged, and a sparse surface in which the line portions 12 are arranged sparsely. Of the transfer surface 30t of the resist film 30, a surface facing the dense surface of the contact surface 10c of the template 10x is referred to as a dense region ARd. In addition, of the transfer surface 30t of the resist film 30, a surface facing the sparse surface of the contact surface 10c of the template 10x is referred to as a sparse region ARs.

That is, the dense region ARd of the resist film 30 is a planar region in which an area occupied by the line portion 12 per unit area on the transfer surface 30t of the resist film 30 is large. In addition, the sparse region ARs of the resist film 30 is a planar region in which an area occupied by the line portion 12 per unit area on the transfer surface 30t of the resist film 30 is small.

Note that a distance between the template 10 and the wafer W is adjusted such that when the template 10x is pressed against the resist film 30, an upper end of the columnar portion 13 on the line portion 12, which is the highest portion in the template 10x, does not penetrate the resist film 30 to reach the workpiece film 21. This is for suppressing damage to the template 10 and the wafer W due to contact between the template 10, and the workpiece film 21 and the wafer W.

FIG. 3B is a cross-sectional view illustrating a state in which the template 10x is pressed against the resist film 30.

As illustrated in FIG. 3B, when the template 10x is pressed, the resist film 30 having a substantially uniform film thickness is pushed away by the line portion 12 and the columnar portion 13 of the template 10x, and the volume of the resist film 30 in the pushed away portion is reduced.

In the dense region ARd of the resist film 30, more line portions 12 and columnar portions 13 are pressed, and therefore the volume reduction amount of the resist film 30 is large. Therefore, a region of the resist film 30 which includes the resist film 30 in a depth direction of the dense region ARd and whose volume has been reduced largely is referred to as a low volume portion VLd. That is, the low volume portion VLd is a three-dimensional region in which the volume of the resist film 30 per unit area on the transfer surface 30t of the resist film 30 is small.

In the sparse region ARs of the resist film 30, only a small number of line portions 12 and columnar portions 13 are pressed, and the volume reduction amount of the resist film 30 is small. Therefore, a region of the resist film 30 which includes the resist film 30 in a depth direction of the sparse region ARs and whose volume has not been reduced so much is referred to as a high volume portion VLs. That is, the high volume portion VLs is a three-dimensional region in which the volume of the resist film 30 per unit area on the transfer surface 30t of the resist film 30 is large.

When a design pattern of the template 10 of the embodiment is generated, in a case where a difference in the volume of the resist film 30 between the low volume portion VLd and the high volume portion VLs is expected to exceed a specified value, a dummy pattern is added to the high volume portion VLs.

Figure 3C:
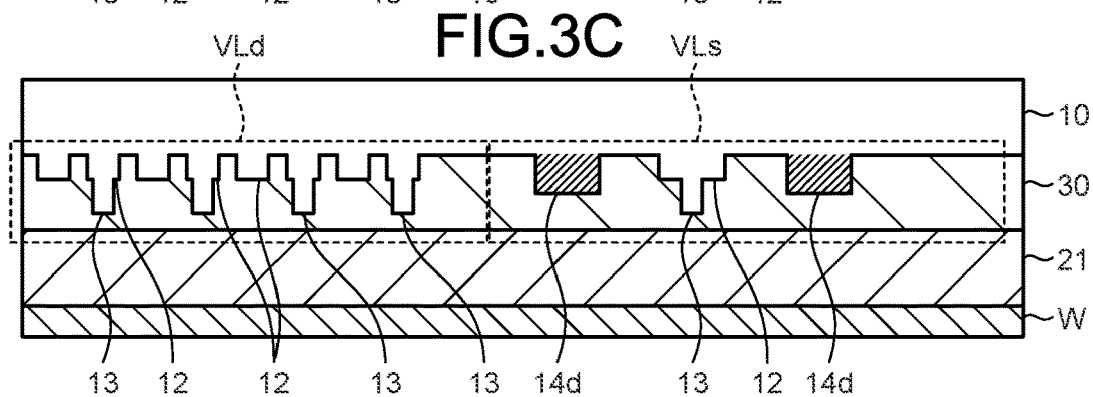

FIG. 3C is a cross-sectional view illustrating the template 10 to which the dummy portion 14d is added based on a dummy pattern added to the design pattern. The template 10 to which the dummy portion 14d is added in addition to the line portion 12 and the columnar portion 13 is, for example, the template 10 of the embodiment to be actually manufactured.

As illustrated in FIG. 3C, the dummy portion 14d having a predetermined volume is added to a region of the template 10 facing the high volume portion VLs of the resist film 30. As a result, the volume of the resist film 30 of the high volume portion VLs is reduced, and the difference in the volume of the resist film 30 between the low volume portion VLd and the high volume portion VLs is reduced.

Note that when the dummy portion 14d is added to the template 10, the number, arrangement, and areas of the dummy portions 14d to be added, the heights of the dummy portions 14d from the contact surface 10c of the template 10, and the like are adjusted. When a plurality of dummy portions 14d is added, the number, arrangements, areas, heights, and the like of the dummy portions 14d may be different among the dummy portions 14d.

Here, there is a restriction on the number of dummy portions 14d that can be added. This is because when the number of dummy portions 14d is excessively increased in order to increase the volume, manufacturing of the template 10 is complicated, and manufacturing time may be prolonged or manufacturing cost may be increased.

In addition, there is a restriction on arrangement positions of the dummy portions 14d so as not to affect an arrangement of the wiring 42 and the via 43 of the dual damascene structure 45 to be formed later and electrical characteristics such as a line-to-line capacitance, and similarly, there is also a restriction on increasing the areas of the dummy portions 14d. The area of the conductive material embedded in dummies 44d (see FIG. 1E) corresponding to the dummy portions 14d may conflict with a maximum area rule.

Therefore, the volume of the dummy portions 14d to be added may be increased by the height of each of the dummy portions 14d in preference to the number, arrangement, and area of the dummy portions 14d.

Note that when the volume of the dummy portions 14d is increased by the height of each of the dummy portions 14d, the height of each of the dummy portions 14d may be equal to, for example, at least one of the height of the line portion 12 and the height of the columnar portion 13 not including the line portion 12. As a result, it is easy to adjust the height of each of the dummy portions 14d for reducing the volume of the resist film 30 in the high volume portion VLs.

Meanwhile, when the height of each of the dummy portions 14d is equal to the total height of the line portion 12 and the columnar portion 13, there is a possibility that the conductive material of the dummy 44d (see FIG. 1E) corresponding to the dummy portion 14d is electrically connected to a lower layer structure of the workpiece film 21. Therefore, when the height of each of the dummy portions 14d is adjusted to the total height of the line portion 12 and the columnar portion 13, it is further necessary to adjust the height of each of the dummy portions 14d, for example, to be less than the total height of the line portion 12 and the columnar portion 13.

As described above, the height of each of the dummy portions 14d can be, for example, equal to or more than the height of the line portion 12 and less than the height of the columnar portion 13 including the height of the line portion 12.

Figure 3D:
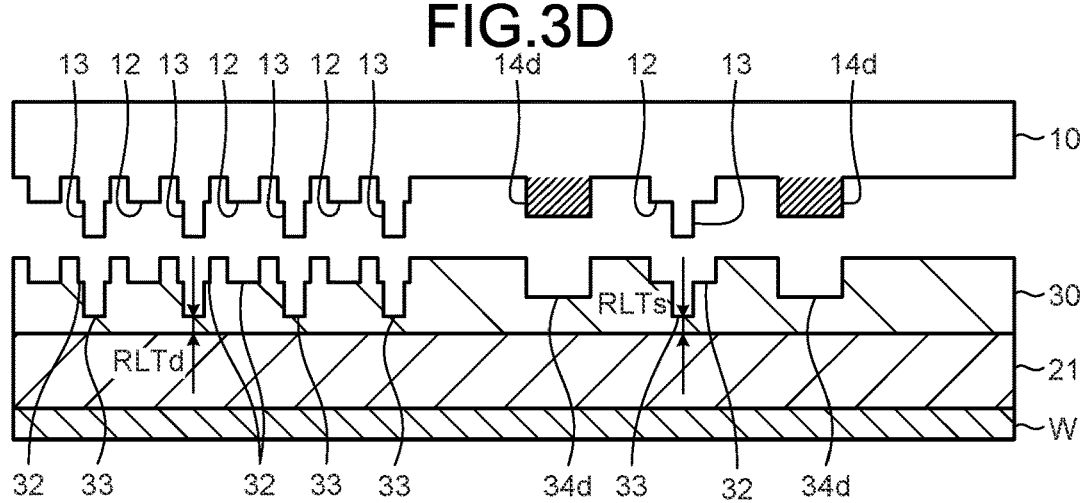

FIG. 3D is a cross-sectional view illustrating a state in which the template 10 is released from the resist film 30 after the wiring pattern 32, the via pattern 33, and the dummy pattern 34d are transferred to the resist film 30.

When pattern transfer to the resist film 30 is performed, before the template 10 is released, for example, ultraviolet light or the like is emitted from above the template 10 in a state as illustrated in FIG. 3C to cure the resist film 30. When the resist film 30 is formed of a thermosetting resist instead of a photocurable resist, heat is applied to the resist film 30 to cure the resist film 30. As a result, the resist film 30 having the wiring pattern 32, the via pattern 33, and the dummy pattern 34d is formed.

Note that when the resist film 30 is cured, the template 10 is maintained at a position where the columnar portion 13 does not penetrate the resist film 30 as described above. Therefore, resist residual films RLTd and RLTs are formed at a bottom of the via pattern 33. The above-described difference in the volume of the resist film 30 between the low volume portion VLd and the high volume portion VLs also affects the film thicknesses of the resist residual films RLTd and RLTs in the low volume portion VLd and the high volume portion VLs.

For example, when the difference in volume between the low volume portion VLd and the high volume portion VLs exceeds a specified value, a large amount of excessive resist material that has not been used for formation of the transfer pattern is generated in the low volume portion VLd as compared with the high volume portion VLs. In the low volume portion VLd, the excessive resist material forms the resist residual film RLTd thicker than the resist residual film RLTs in the high volume portion VLs. Therefore, in the low volume portion VLd, etching of the workpiece film 21 to which the via pattern 33 is transferred may be inhibited.

Since the dummy portion 14d is formed in the template 10 of the embodiment, the difference in volume between the low volume portion VLd and the high volume portion VLs is, for example, less than a specified value, and a difference in film thickness between the resist residual film RLTd in the low volume portion VLd and the resist residual film RLTs in the high volume portion VLs is suppressed, and the etching inhibition of the workpiece film 21 is suppressed.

By the way, as described above, there are restrictions on the number, arrangement, area, heights, and the like of the dummy portions 14d to be added. Therefore, even if the dummy portions 14d are designed such that the volume of the dummy portions 14d is maximized within a possible range, the difference in the volume of the resist film 30 between the low volume portion VLd and the high volume portion VLs is not necessarily within a specified value.

In such a case, it is considered to reduce the total volume of the line portion 12 and the columnar portion 13. As described above, the total volume of the line portion 12 and the columnar portion 13 can be more largely reduced by reducing the volume of the line portion 12 than by reducing the volume of the columnar portion 13. Therefore, it is considered to lower the line portion 12 mainly in order to reduce the volume of the line portion 12.

Figure 4A:
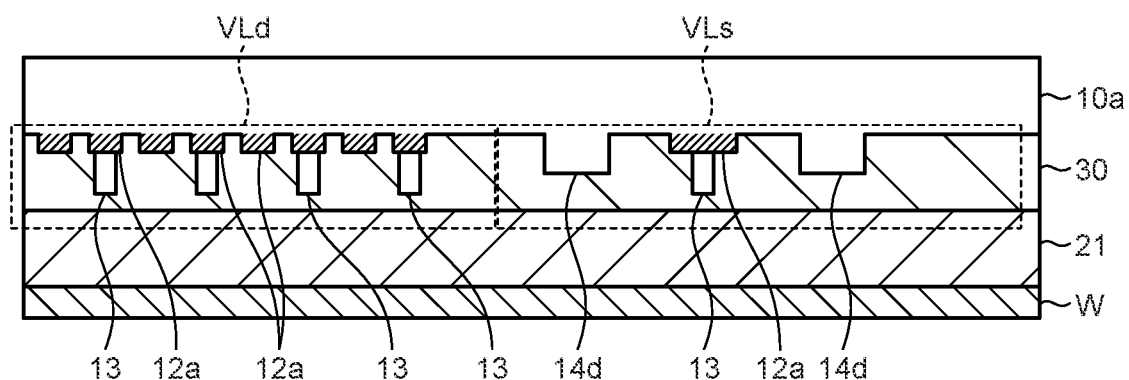
FIGS. 4A and 4B are conceptual diagrams of the design pattern generation method according to the embodiment.

FIG. 4A is a cross-sectional view including a template 10a including a line portion 12a set lower in addition to the dummy portion 14d.

As illustrated in FIG. 4A, the template 10a includes, for example, the dummy portion 14d having the largest possible volume, the line portion 12a reset so as to be lower than the actual pattern based on the original layout information, and the columnar portion 13 uncorrected from the actual pattern based on the original layout information.

When the height of the line portion 12a is adjusted, it is preferable to set a difference in height between the line portion 12 before correction and the line portion 12a after correction within a range of an etching error of the workpiece film 21. In this case, even in a case of using the line portion 12a lower than the original design, the workpiece film 21 is etched in a substantially similar manner to a case of using the line portion 12 according to the original design. In addition, the thickness of the finally formed wiring 42 can be maintained substantially as originally designed.

Note that when the lowered line portion 12a is arranged in the low volume portion VLd, the height of the line portion 12a arranged in the high volume portion VLs may be equal to the height of the lowered line portion 12a arranged in the low volume portion VLd. By making the heights of the line portions 12a arranged in the template 10a uniform, the template 10a can be easily manufactured. As in the case of the low volume portion VLd, by arranging the lowered line portion 12a also in the high volume portion VLs, the volume of the resist film 30 in the high volume portion VLs slightly increases, but since the total volume of the line portions 12a arranged in the low volume portion VLd is overwhelmingly larger, it is possible to offset a difference in the volume of the resist film 30 between the low volume portion VLd and the high volume portion VLs.

Figure 4B:
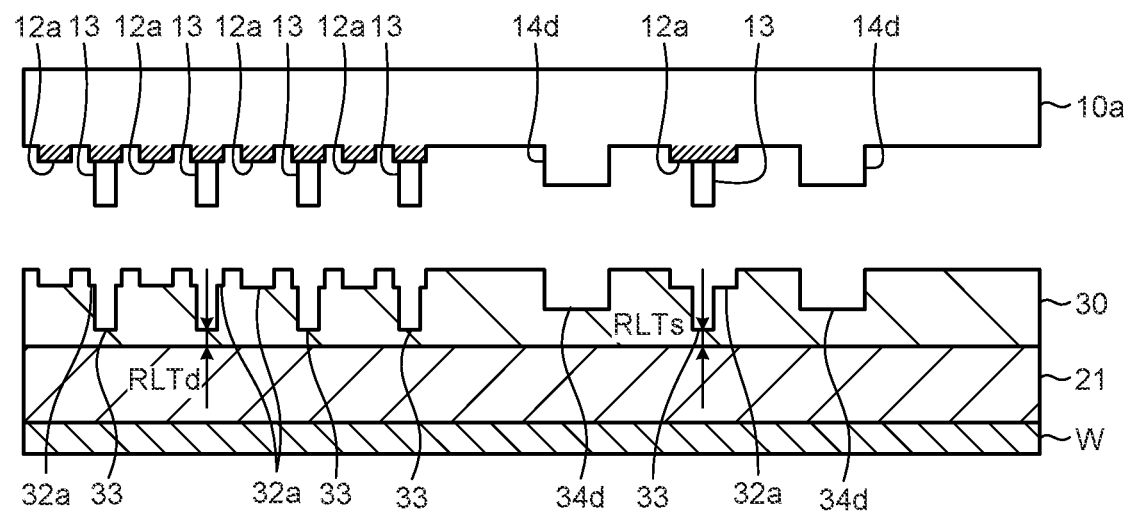

FIG. 4B is a cross-sectional view illustrating a state in which the template 10a is released from the resist film 30 after the wiring pattern 32a, the via pattern 33, and the dummy pattern 34d are transferred to the resist film 30.

The lowered line portion 12a included in the template 10a is transferred to the resist film 30. As a result, the wiring pattern 32a is lower than the original wiring pattern 32 and has a smaller volume.

As a result, the volume of the resist film 30 in the low volume portion VLd increases, and the difference in the volume of the resist film 30 between the low volume portion VLd and the high volume portion VLs is further reduced. In addition, the difference in film thickness between the resist residual film RLTd in the low volume portion VLd and the resist residual film RLTs in the high volume portion VLs is further suppressed, and the etching inhibition of the workpiece film 21 is further suppressed.

How to determine the addition of the dummy pattern and determine the volume of the dummy pattern has been conceptually described above.

(Example of Design Pattern Generation Process)

Next, an example of a design pattern generation process by the design pattern generation device 100 of the embodiment will be described with reference to FIG. 5.

In the above description of the method for generating a design pattern using FIGS. 3A to 4B, the dummy pattern is added based on a local difference in the volume of the resist film 30 when the actual pattern of the virtual template 10x is transferred. Here, the difference in the volume of the resist film 30 after the pattern transfer substantially coincides with the difference in the volume of the pattern of the template 10x.

In the design pattern generation device 100 of the embodiment, as described below, addition of the dummy pattern is determined based on a difference in the volume of the actual pattern of the template 10x so as to reduce the difference, for example, without calculating the volume of the resist film 30 to which the actual pattern is transferred.

Hereinafter, a process of generating a design pattern for manufacturing the above-described template 10 will be described. According to the generated design pattern, it is possible to manufacture the template 10 capable of transferring the recessed pattern 35 (see FIG. 1B) to the resist film 30 applied to the wafer W or the like.

Figure 5:
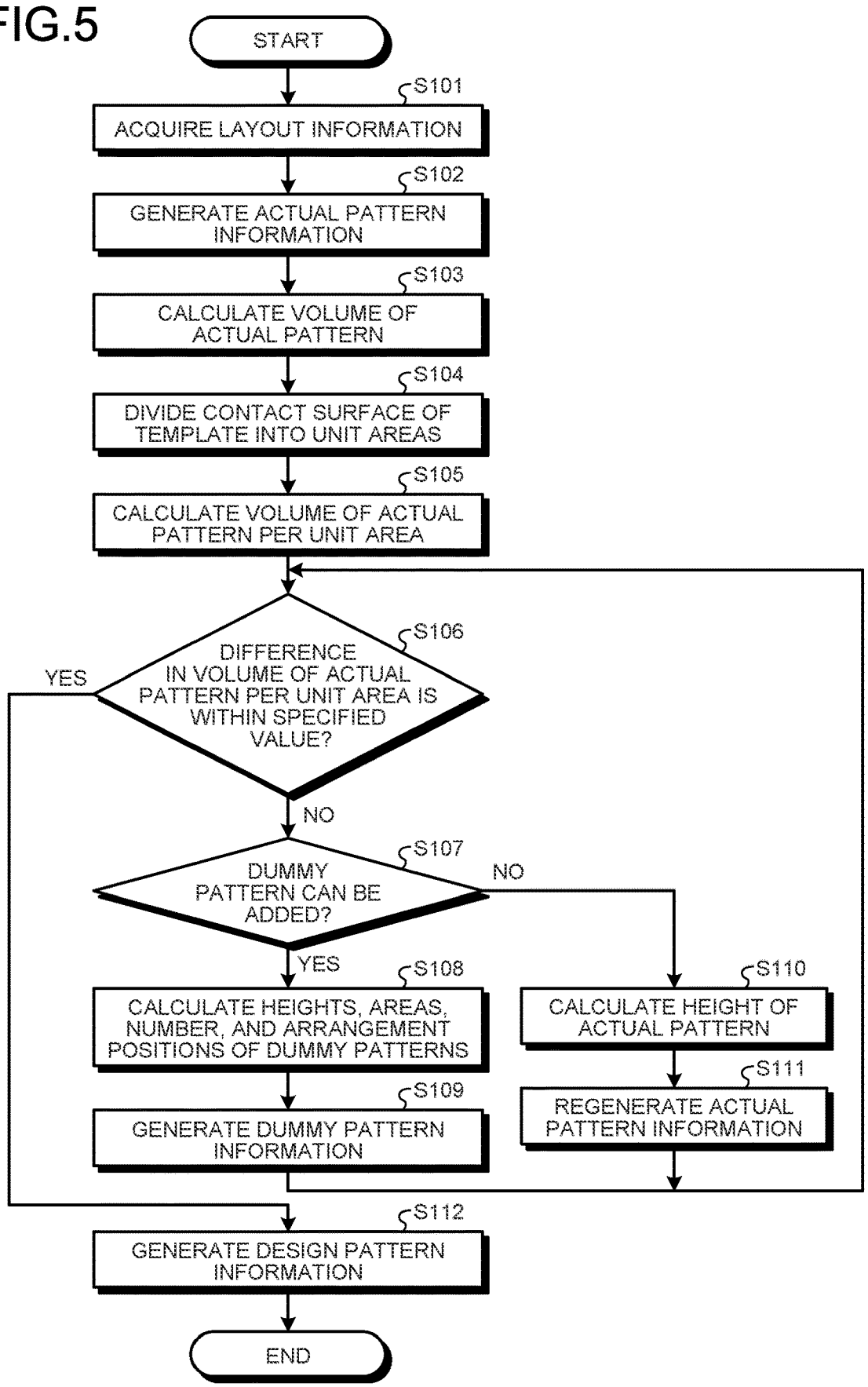
FIG. 5 is a flowchart illustrating an example of a procedure of a design pattern generation process according to the embodiment.

FIG. 5 is a flowchart illustrating an example of a procedure of a design pattern generation process according to the embodiment.

As illustrated in FIG. 5, the layout information acquisition unit 101 of the design pattern generation device 100 acquires layout information on the recessed pattern 35 to be transferred to the resist film 30 (step S101). The layout information includes information on the wiring pattern 32 recessed from the transfer surface 30t of the recessed pattern 35 of the resist film 30 and information on the via pattern 33 further recessed from a bottom surface of the wiring pattern 32.

The actual pattern generation unit 106 of the design pattern generation device 100 generates actual pattern information including a line pattern and a columnar pattern based on the layout information (step S102).

The line pattern is a pattern protruding from the contact surface 10c of the template 10 with the resist film 30 and extending in a predetermined direction along the contact surface 10c. The columnar pattern is a pattern having a columnar shape further protruding from an upper surface of the line pattern.

The volume calculation unit 102 calculates the volume of the line pattern and the columnar pattern per unit area on the contact surface 10c of the template 10 (steps S103 to S105).

More specifically, the volume calculation unit 102 calculates the volume of the line pattern and the columnar pattern based on the actual pattern information (step S103). In addition, the volume calculation unit 102 divides the contact surface 10c of the template 10 into unit areas (step S104). In addition, the volume calculation unit 102 calculates the volume of the line pattern and the columnar pattern per unit area on the contact surface 10c based on the calculated volume of the line pattern and the columnar pattern (step S105).

If a difference in the volume of the line pattern and the columnar pattern per unit area exceeds a specified value, the design pattern generation device 100 adds a dummy pattern to a region where the volume per unit area is large (steps S106 to S109).

More specifically, the determination unit 103 determines whether or not the difference in the volume of the line pattern and the columnar pattern per unit area exceeds a specified value (step S106). If the difference in volume per unit area exceeds a specified value (step S106: No), the determination unit 103 determines whether or not a dummy pattern can be added without violating restrictions on the number, arrangement, area, heights, and the like of dummy patterns (step S107).

If the difference in volume per unit area exceeds a specified value (step S106: No) and a dummy pattern can be added (step S107: Yes), the dummy pattern generation unit 105 calculates the height, area, number, arrangement position, and the like necessary for the dummy patterns to be added (step S108).

Note that the region where the volume per unit area is large and to which a dummy pattern is added is a region in the contact surface 10c of the template 10, and is a region corresponding to the high volume portion VLs in the low volume portion VLd and the high volume portion VLs in the resist film 30 after pattern transfer, for example, as described above with reference to FIGS. 3A to 4B.

Here, for example, the dummy pattern generation unit 105 preferentially adjusts the height of the dummy pattern in order to correct the difference in the volume of the line pattern and the columnar pattern per unit area. That is, the dummy pattern generation unit 105 adjusts the height of the dummy pattern to a height equal to or more than the height of the line pattern and less than the height of the columnar pattern including the height of the line pattern according to the difference in the volume of the line pattern and the columnar pattern per unit area. More specifically, the dummy pattern generation unit 105 sets the height of the dummy pattern within the above range such that the larger the difference in the volume of the line pattern and the columnar pattern per unit area, the higher the dummy pattern.

In addition, even when the dummy pattern generation unit 105 preferentially adjusts the height of the dummy pattern, in order to correct the difference in the volume of the line pattern and the columnar pattern per unit area, for example, the dummy pattern generation unit 105 may further adjust the area of the dummy pattern on the contact surface 10c and may adjust the number of the dummy patterns according to the difference in the volume of the line pattern and the columnar pattern per unit area. That is, the dummy pattern generation unit 105 may increase the area of the dummy pattern within the above restrictions and may increase the number of the dummy patterns within the above restrictions as the difference in the volume of the line pattern and the columnar pattern per unit area increases.

When the design of the dummy pattern is determined, the dummy pattern generation unit 105 generates dummy pattern information including the height, area, number, arrangement position, and the like necessary for the dummy pattern (step S109).

Thereafter, the design pattern generation device 100 returns to the process in step S106.

Meanwhile, for example, in a predetermined case described below, the actual pattern generation unit 106 reduces the total volume of the line pattern and the columnar pattern in a region where the volume per unit area is small in the contact surface 10c of the template 10, that is, in a region corresponding to the low volume portion VLd smaller than the high volume portion VLs of the resist film 30.

That is, if the difference in volume per unit area exceeds a specified value (step S106: No) but a dummy pattern cannot be added (step S107: No) as in a case where the difference in the volume of the line pattern and the columnar pattern per unit area is not eliminated even by adding a dummy pattern having the largest possible volume, for example, the actual pattern generation unit 106 preferentially adjusts the height of the line pattern in order to correct the difference in the volume of the line pattern and the columnar pattern per unit area, and calculates the height of the line pattern when the height is reduced by a necessary amount (step S110).

That is, the actual pattern generation unit 106 adjusts the height of the line pattern according to the difference in the volume of the line pattern and the columnar pattern per unit area. More specifically, the actual pattern generation unit 106 designs the line pattern to be thinner as the difference in the volume of the line pattern and the columnar pattern per unit area is larger.

In addition, even when the height of the line pattern is preferentially adjusted, for example, the actual pattern generation unit 106 may further adjust the diameter of the columnar pattern in order to correct the difference in the volume of the line pattern and the columnar pattern per unit area. That is, the actual pattern generation unit 106 may decrease the diameter of the columnar pattern as the difference in the volume of the line pattern and the columnar pattern per unit area increases.

After adjusting the height of the actual pattern of at least one of the line pattern and the columnar pattern, the actual pattern generation unit 106 regenerates actual pattern information (step S111). At this time, when the height adjustment process is performed only on the line pattern, the actual pattern information includes information on the corrected line pattern and the uncorrected columnar pattern. When the height adjustment process is performed on both the line pattern and the columnar pattern, the actual pattern information includes information on the corrected line pattern and the corrected columnar pattern.

Thereafter, the design pattern generation device 100 returns to the process in step S106.

In step S106, if the determination unit 103 determines that the difference in volume per unit area is within a specified value (step S106: Yes), the integration unit 107 generates design pattern information (step S112). When processes in steps S107 to S109 are performed, the design pattern information includes dummy pattern information and actual pattern information. At this time, when processes in steps S110 and S111 are further performed, the actual pattern information included in the design pattern information is actual pattern information including the corrected actual pattern. When processes in steps S107 to S109 are not performed, the design pattern information includes actual pattern information.

As described above, the design pattern generation process by the design pattern generation device 100 of the embodiment ends.

Note that the method for determining whether or not a dummy pattern needs to be added is not limited to the above method. As an example, a difference in the volume of the resist film 30 after pattern transfer may be calculated once from the acquired layout information, and then the difference in the volume of the resist film 30 may be converted into a difference in the volume of the actual pattern of the template 10.

(Configuration Example of Template)

Figure 6A:
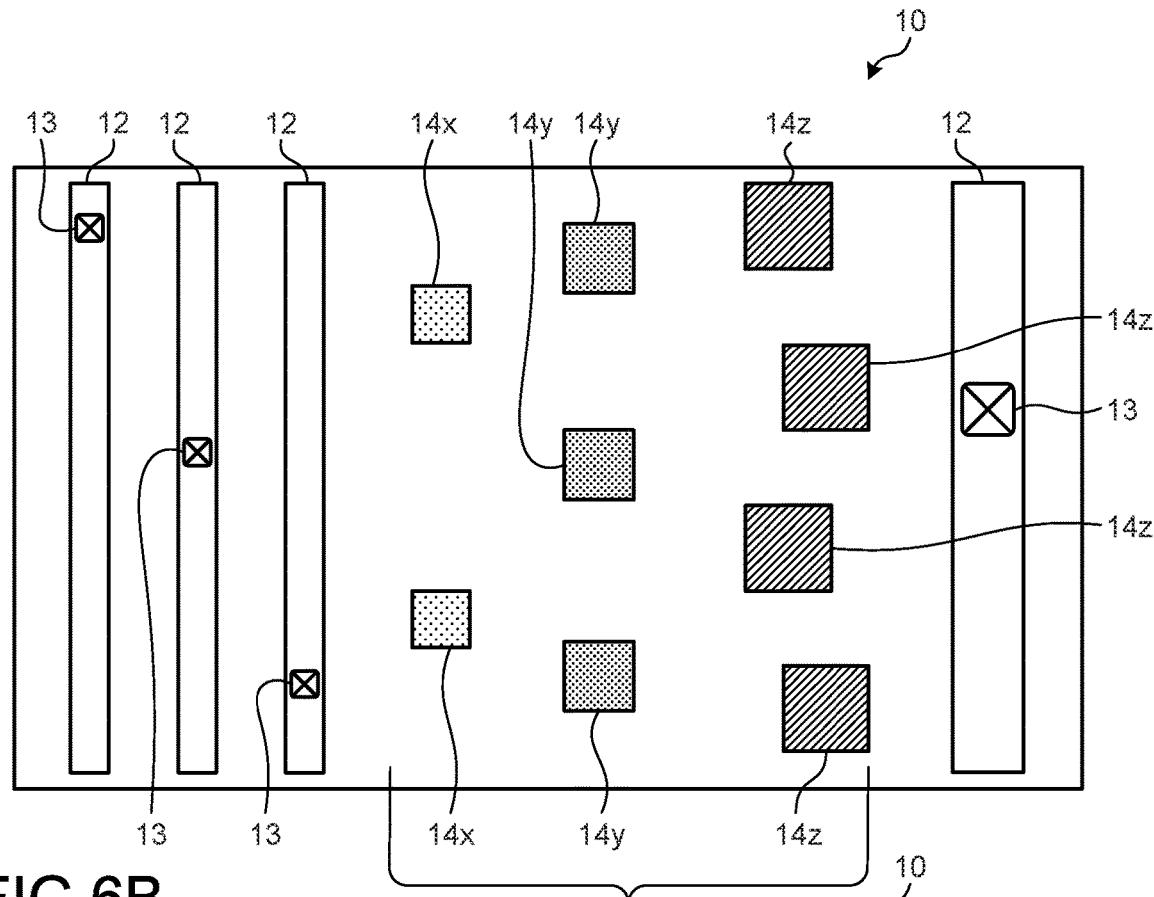
FIGS. 6A and 6B are diagrams illustrating an example of a configuration of a template according to the embodiment.
Figure 6B:
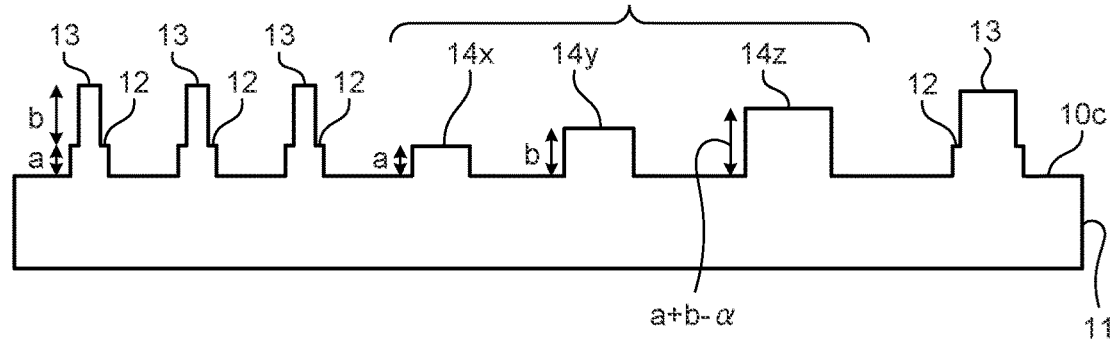

Next, a configuration example of the template 10 of the embodiment will be described with reference to FIGS. 6A and 6B. FIGS. 6A and 6B are diagrams illustrating an example of a configuration of the template 10 according to the embodiment. The template 10 of the embodiment is, for example, a template manufactured based on the design pattern generated by the above-described design pattern generation device 100.

As illustrated in FIGS. 6A and 6B, the template 10 includes the substrate 11, the line portion 12, the columnar portion 13, and the dummy portion 14d (14x, 14y, and 14z).

The substrate 11 as a second substrate constitutes a main body of the template 10 and has the contact surface 10c as a first surface in contact with the resist film 30. The substrate 11 is made of a material transparent to ultraviolet light, such as quartz.

The line portion 12 is formed integrally with the substrate 11 and protrudes from the contact surface 10c of the substrate 11. The line portion 12 extends, for example, in a predetermined direction above the substrate 11. However, the line portion 12 may be arranged so as to be bent above the substrate 11.

The columnar portion 13 is formed integrally with the line portion 12 and arranged on an upper surface of the line portion 12. The columnar portion 13 has a cross section parallel to the substrate 11, for example, having a circular shape, an elliptical shape, or an oval shape.

Note that in the example of FIGS. 6A and 6B, the line portion 12 and the columnar portion 13 are densely arranged in a region near one end of the template 10. In addition, the line portion 12 and the columnar portion 13 are sparsely arranged in a region near the other end of the template 10.

The dummy portion 14d as a structural portion having a predetermined structure is arranged in a region where the total volume of the line portion 12 and the columnar portion 13 is smaller than that in another region. The region where the total volume of the line portion 12 and the columnar portion 13 is small is a region where the line portion 12 and the columnar portion 13 are sparsely arranged, and corresponds to, for example, the sparse region ARs in the above-described resist film 30. The other region, that is, the region where the total volume of the line portion 12 and the columnar portion 13 is large is a region where the line portion 12 and the columnar portion 13 are densely arranged, and corresponds to, for example, the dense region ARd in the above-described resist film 30.

In addition, the dummy portion 14d is formed integrally with the substrate 11 and protrudes from the contact surface 10c of the substrate 11. In addition, the dummy portion 14d has a height equal to or more than the height of the line portion 12 and less than the height of the columnar portion 13 on the line portion 12. Any type of the dummy portion 14d and any number of the dummy portions 14d may be used.

When a plurality of types of dummy portions 14d, in which each type includes a plurality of dummy portions 14d, is arranged in the template 10, for example, the dummy portions 14d can be arranged such that the density of the dummy portions 14d increases from one end side of the template 10 in which the line portion 12 and the columnar portion 13 are densely arranged toward the other end side of the template 10 in which the line portion 12 and the columnar portion 13 are sparsely arranged. That is, the dummy portions 14d can be arranged such that the height of each of the dummy portions 14d increase, the area of each of the dummy portions 14d on the contact surface 10c of the substrate 11 increases, and the number of the dummy portions 14d increases from one end side to the other end side of the template 10.

In the example of FIGS. 6A and 6B, the template 10 includes a plurality of types of dummy portions 14x, 14y, and 14z, in which the number of the dummy portions 14x is plural, the number of the dummy portions 14y is plural, and the number of the dummy portions 14z is plural. The dummy portions 14x, 14y, and 14z have different heights, different areas on the contact surface 10c of the substrate 11, and different numbers, and are arranged such that the density increases from one end side to the other end side of the template 10.

Among the dummy portions 14x, 14y, and 14z, the dummy portion 14x is arranged closest to one end of the template 10, is the lowest, has the smallest area, and has the smallest number. The dummy portion 14x has, for example, a height substantially equal to that of the line portion 12.

The dummy portion 14y is arranged at a position between one end and the other end of the template 10, has a medium height and a medium area among the dummy portions 14x, 14y, and 14z, and has a larger number than the dummy portion 14x and a smaller number than the dummy portion 142. For example, the dummy portion 14y has the same height as the height of the columnar portion 13 not including the line portion 12. That is, the length of the dummy portion 14y in the height direction is substantially equal to the length of the columnar portion 13 in the height direction.

Among the dummy portions 14x, 14y, and 14z, the dummy portion 14z is arranged closest to the other end of the template 10, is the highest, has the largest area, and has the largest number. For example, the dummy portion 14z is slightly lower than the height of the columnar portion 13 including the line portion 12.

By arranging the dummy portions 14x, 14y, and 14z as described above, for example, a difference in the volume of the resist film 30 between the low volume portion VLd and the high volume portion VLs is reduced as compared with a case where the template 10 does not have the dummy portion 14.

(Method for Manufacturing Template)

Next, a method for manufacturing the template 10 of the embodiment will be described with reference to FIGS. 7A to 9D. FIGS. 7A to 9D are cross-sectional views illustrating an example of a procedure of the method for manufacturing the template 10 according to the embodiment.

Figure 7A:
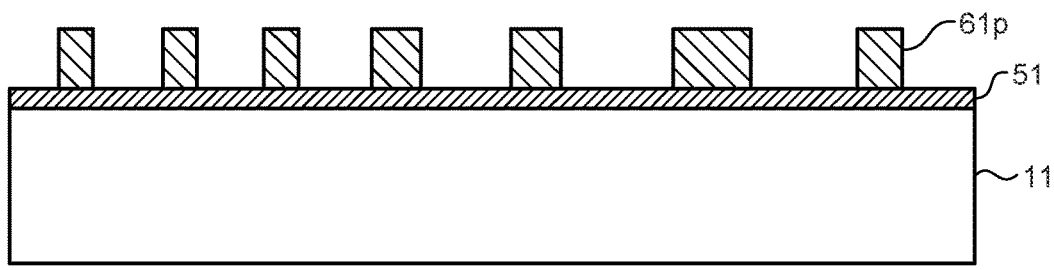
FIGS. 7A to 7E are cross-sectional views illustrating an example of a procedure of a method for manufacturing a template according to the embodiment.

As illustrated in FIG. 7A, a mask film 51 such as a chromium film is formed on an upper surface of the substrate 11 to be a main body of the template 10. A resist pattern 61p is formed on the mask film 51 by, for example, electron beam drawing. The resist pattern 61p covers a region of the substrate 11 where the line portion 12 and the dummy portions 14x, 14y, and 14z are to be arranged.

Figure 7B:
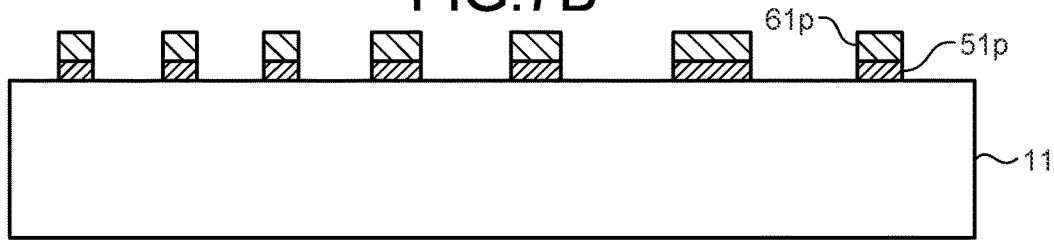

As illustrated in FIG. 7B, the mask film 51 is etched using the resist pattern 61p as a mask to form a mask pattern 51p.

Figure 7C:
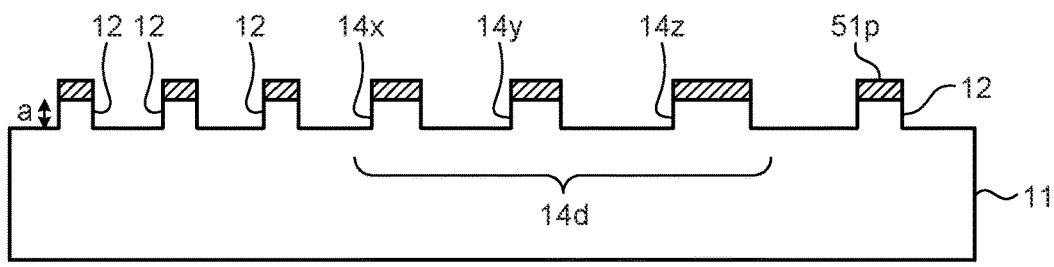

As illustrated in FIG. 7C, the substrate 11 is etched using the mask pattern 51p as a mask to form the line portion 12 and the dummy portions 14x, 14y, and 14z. At this time, the line portion 12 and the dummy portions 14x, 14y, and 147 all have a substantially equal height. The protrusion height of the line portion 12 and the dummy portions 14x, 14y, and 14z from the substrate 11 is, for example, substantially equal to the height of the line portion 12 finally included in the template 10.

Note that in the above process, the resist pattern 61p disappears.

Figure 7D:
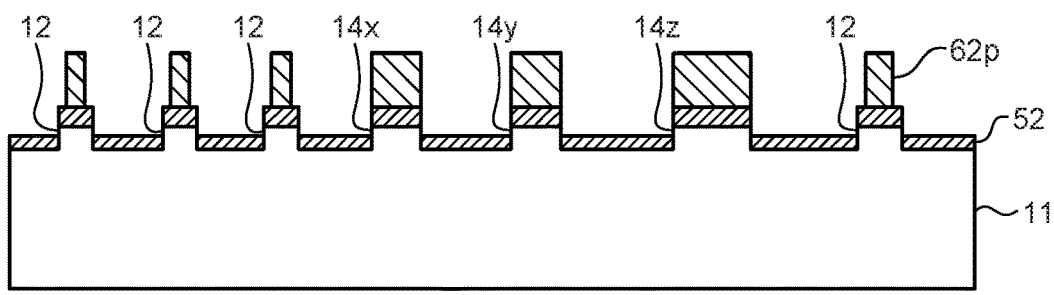

As illustrated in FIG. 7D, after the mask pattern 51p is removed, a mask film 52 such as a chromium film covering the entire surface of the substrate 11 is formed. A resist pattern 62p is formed on the mask film 52 by, for example, electron beam drawing. The resist pattern 62p covers a region of the substrate 11 where the columnar portion 13 and the dummy portions 14x, 14y, and 14z are to be arranged.

Figure 7E:
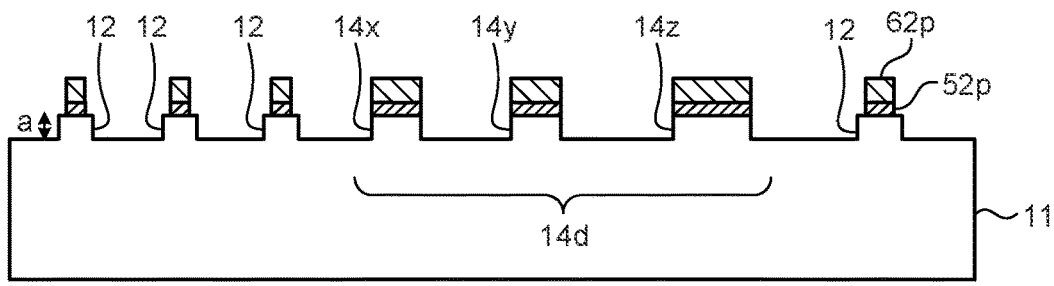

As illustrated in FIG. 7E, the mask film 52 is etched using the resist pattern 62p as a mask to form a mask pattern 52p.

Figure 8A:
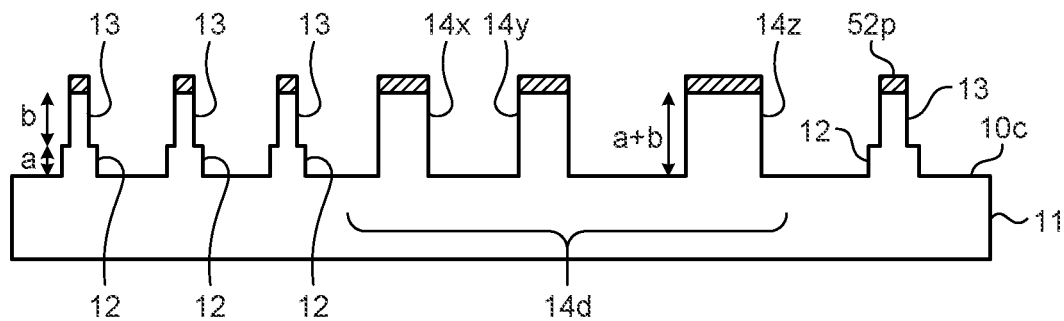
FIGS. 8A to 8C are cross-sectional views illustrating an example of the procedure of the method for manufacturing a template according to the embodiment.

As illustrated in FIG. 8A, the substrate 11 to be a main body of the template 10 is processed to expose the contact surface 10c to be in contact with the resist film 30. In addition, the line portion 12 protruding from the contact surface 10c of the substrate 11, the columnar portion 13 arranged on an upper surface of the line portion 12, and the dummy portions 14x, 14y, and 14z having a height substantially equal to the height of the columnar portion 13 on the line portion 12 are formed. When the line portion 12, the columnar portion 13, and the dummy portions 14x, 14y, and 14z are formed, a plurality of dummy portions 14x, 14y, and 14z having different areas on the contact surface 10c of the substrate 11 may be formed.

That is, the substrate 11 is etched using the mask pattern 52p as a mask to expose the contact surface 10c of the substrate 11. As a result, for example, the line portion 12 is dug down by the same height as the columnar portion 13 finally included in the template 10 and protrudes from the contact surface 10c of the substrate 11. In addition, the columnar portion 13 having the final height of the columnar portion 13 is formed on an upper surface of the line portion 12. In addition, the dummy portions 14x, 14y, and 14z protrude from the contact surface 10c of the substrate 11 at a height substantially equal to the protrusion height of the columnar portion 13 from the substrate 11.

Note that in the above process, the resist pattern 62p disappears.

As illustrated in FIGS. 8B to 9A, a resist pattern 63p which covers the line portion 12, the columnar portion 13, and the dummy portions 14x, 14y, and 14z and in which a film thickness above the dummy portions 14x, 14y, and 14z is smaller than a film thickness above the line portion 12 and the columnar portion 13 is formed by an imprint process.

More specifically, when the resist pattern 63p is formed, the resist patterns 63p in which film thicknesses above the plurality of dummy portions 14x, 14y, and 14z are different from one another is formed by an imprint process. The processes of FIGS. 8B to 9A will be described in detail below.

Figure 8B:
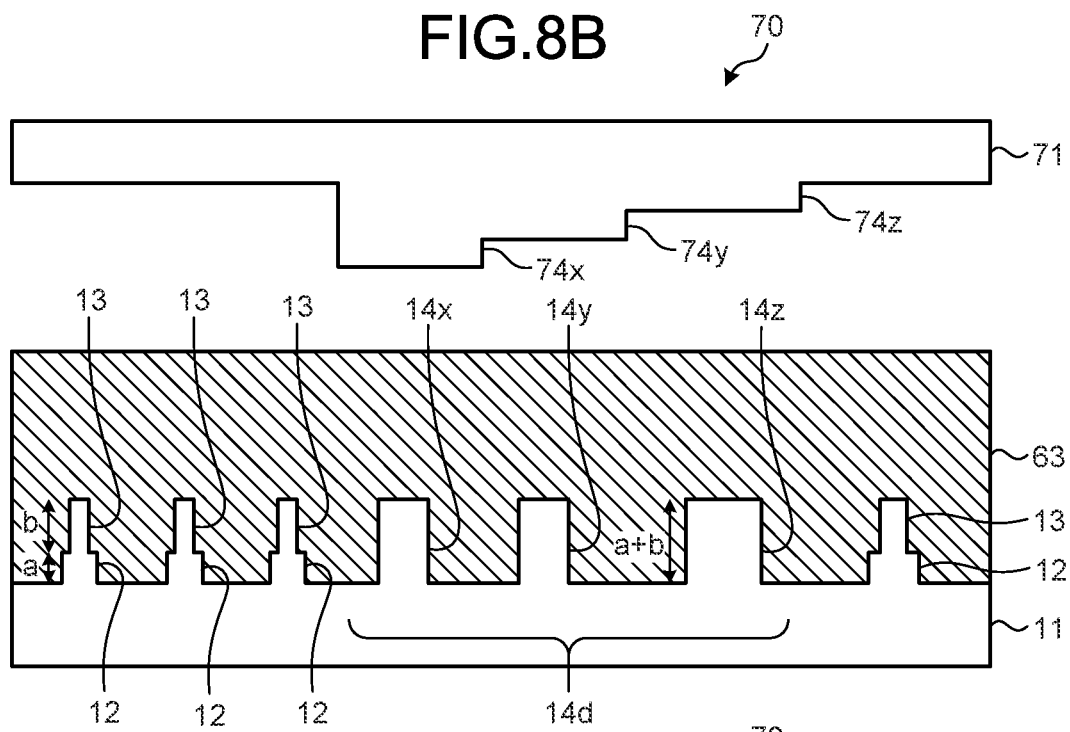

As illustrated in FIG. 8B, after the mask pattern 52p is removed, a resist film 63 covering the entire surface of the substrate 11 is formed by, for example, spin coating. As a result, the whole of the line portion 12, the columnar portion 13, and the dummy portions 14x, 14y, and 14z on the substrate 11 is covered with the resist film 63 having a substantially flat upper surface.

In addition, a step-shaped template 70 having patterns 74x, 74y, and 74z is arranged above the substrate 11 such that the patterns 74x, 74y, and 74z face the substrate 11. More specifically, when the step-shaped template 70 is arranged above the substrate 11, the patterns 74x, 74y, and 74z are arranged at positions above the dummy portions 14x, 14y, and 14z, respectively.

Here, a substrate 71 of the step-shaped template 70 is made of a material transparent to ultraviolet light, such as quartz. The patterns 74x, 74y, and 74z of the step-shaped template 70 protrude from the substrate 71 constituting a main body of the step-shaped template 70 at different protrusion heights.

Among the patterns 74x, 74y, and 74z, the pattern 74x protrudes at the largest height. Among the patterns 74x, 74y, and 74z, the pattern 74y protrudes at a medium height. Among the patterns 74x, 74y, and 74Z, the pattern 74z protrudes at the smallest height. As a result, the patterns 74x, 74y, and 74z have a step shape ascending from the pattern 74z to the pattern 74x.

Figure 8C:
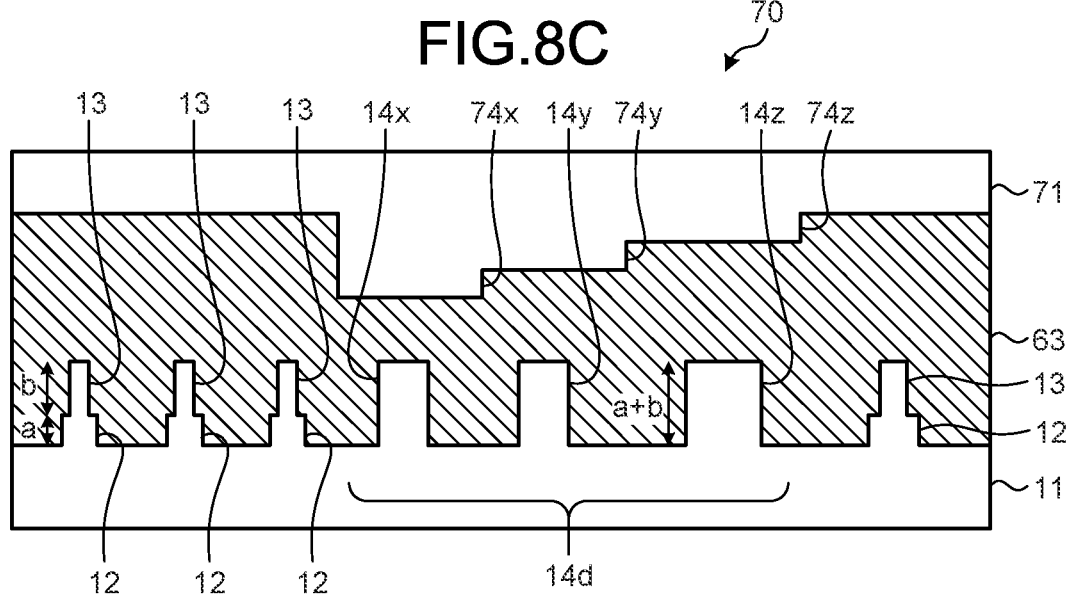

As illustrated in FIG. 8C, the patterns 74x, 74y, and 74z of the step-shaped template 70 are pressed against the resist film 63 on the substrate 11, and ultraviolet light is emitted from above the step-shaped template 70 to transfer the patterns 74x, 74y, and 74z to the resist film 63.

As illustrated in FIG. 9A, the patterns 74x, 74y, and 74z are transferred to the resist film 63 to form the resist pattern 63p. The film thickness of the resist pattern 63p above the dummy portions 14x, 14y, and 14z is smaller than, for example, that of the resist pattern 63p above the line portion 12 and the columnar portion 13.

More specifically, in the resist pattern 63p above the dummy portions 14x, 14y, and 14z, the resist pattern 63p above the dummy portion 14x to which the pattern 74x has been transferred has the smallest film thickness. In the resist pattern 63p above the dummy portions 14x, 14y, and 14z, the resist pattern 63p above the dummy portion 14y to which the pattern 74y has been transferred has a medium film thickness. In the resist pattern 63p above the dummy portions 14x, 14y, and 14z, the resist pattern 63p above the dummy portion 14Z to which the pattern 74z has been transferred has the largest film thickness.

As illustrated in FIGS. 9B to 9D, the resist pattern 63p is etched back to expose the dummy portions 14x, 14y, and 14z to a surface of the resist pattern 63p. In addition, the exposed dummy portions 14x, 14y, and 14z are further etched back to form the dummy portions 14x, 14y, and 14z each having a height less than the height of the columnar portion 13 on the line portion 12.

More specifically, when the dummy portions 14x, 14y, and 14z are etched back, the resist pattern 63p is etched back to sequentially expose the plurality of dummy portions 14x, 14y, and 14z, and the plurality of dummy portions 14x, 14y, and 14z is sequentially etched back to form the plurality of dummy portions 14x, 14y, and 14z having different heights equal to or more than the height of the line portion 12 and less than the height of the columnar portion 13. The processes of FIGS. 9B to 9D will be described in detail below.

As illustrated in FIG. 9B, the step-shaped resist pattern 63p is etched back. As a result, in the dummy portions 14x, 14y, and 14z, first, an upper end of the dummy portion 14x is exposed to an upper surface of the resist pattern 63p.

As illustrated in FIG. 9C, the resist pattern 63p is further continuously etched back. At this time, by using an etch-back condition capable of etching not only the resist pattern 63p but also the dummy portions 14x, 14y, and 14z made of quartz or the like, the upper end of the dummy portion 14x exposed to the upper surface of the resist pattern 63p is also etched.

In addition, by continuously etching back the resist pattern 63p, an upper end of the dummy portion 14y is also exposed to the upper surface of the resist pattern 63p.

As illustrated in FIG. 9D, the resist pattern 63p is further continuously etched back. As a result, the upper ends of the dummy portions 14x and 14y exposed to the upper surface of the resist pattern 63p are further etched.

In addition, by continuously etching back the resist pattern 63p, an upper end of the dummy portion 14z is also exposed to the upper surface of the resist pattern 63p. In addition, after the upper end of the dummy portion 14z is exposed, the resist pattern 63p is further continuously etched back, and the dummy portion 14z is etched back such that the height of the upper end of the dummy portion 14z is slightly (by length α) lower than the height of the columnar portion 13 including the line portion 12. At this time, the upper ends of the dummy portions 14x and 14y may also be slightly etched back.

As described above, the dummy portion 14x having a substantially equal height to the line portion 12, the dummy portion 14y having a substantially equal height to the columnar portion 13 not including the line portion 12, and the dummy portion 14z having a slightly lower height than the columnar portion 13 including the line portion 12 are formed on the contact surface 10c of the substrate 11.

Thereafter, the remaining resist pattern 63p is removed by an ashing process using oxygen plasma or the like.

As described above, the template 10 of the embodiment is manufactured.

(Method for Manufacturing Step-Shaped Template)

Next, a method for manufacturing the step-shaped template 70 will be described with reference to FIGS. 10A to 10F. FIGS. 10A to 10F are cross-sectional views illustrating an example of the method for manufacturing the step-shaped template 70 used for manufacturing the template 10 according to the embodiment.

Figure 10A:
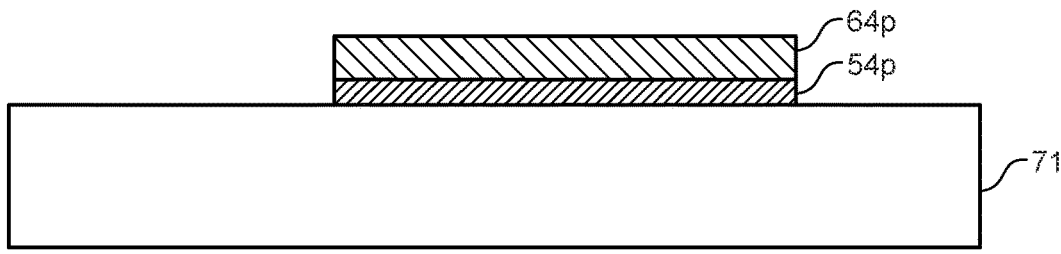
FIGS. 10A to 10F are cross-sectional views illustrating an example of a method for manufacturing a step-shaped template used for manufacturing the template according to the embodiment.

As illustrated in FIG. 10A, the substrate 71 to be a main body of the step-shaped template 70 is prepared. In addition, a mask film such as a chromium film is formed on the substrate 71, and a resist film is formed on the mask film.

The resist film is processed by electron beam drawing or the like to form a resist pattern 64p. The resist pattern 64p covers the entire region of the substrate 71 where the patterns 74x, 74y, and 74z are to be arranged.

The mask film is etched using the resist pattern 64p as a mask to form a mask pattern 54p.

Figure 10B:
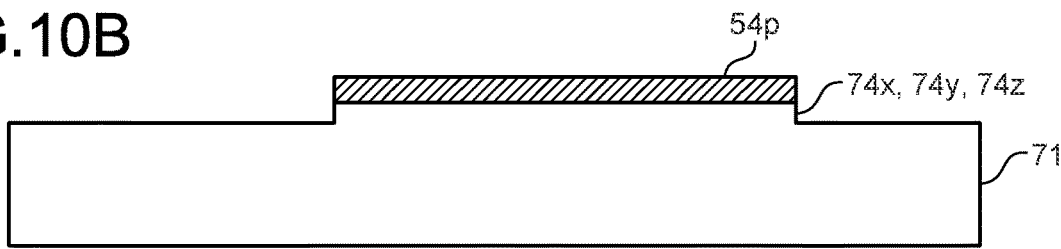

As illustrated in FIG. 10B, the substrate 71 is etched using the mask pattern 54p as a mask to form the patterns 74x, 74y, and 74z protruding from the substrate 71. At this time, the protrusion heights of the patterns 74x, 74y, and 74z from the substrate 71 are all equal to one another. Note that in the process, the resist pattern 64p disappears.

Figure 10C:
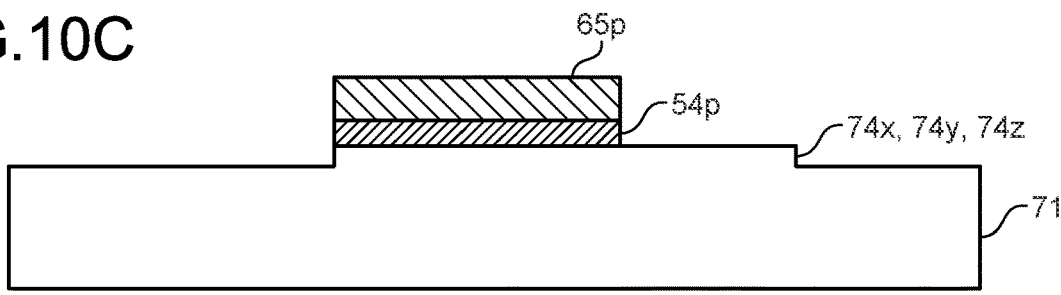

As illustrated in FIG. 10C, a resist pattern 65p is formed on the mask pattern 54p by electron beam drawing or the like. The resist pattern 65p covers regions corresponding to the patterns 74x and 74y in the patterns 74x, 74y, and 74z protruding from the substrate 71.

The mask pattern 54p is etched using the resist pattern 65p as a mask to form the mask pattern 54p covering regions corresponding to the patterns 74x and 74y similarly to the resist pattern 65p.

Figure 10D:
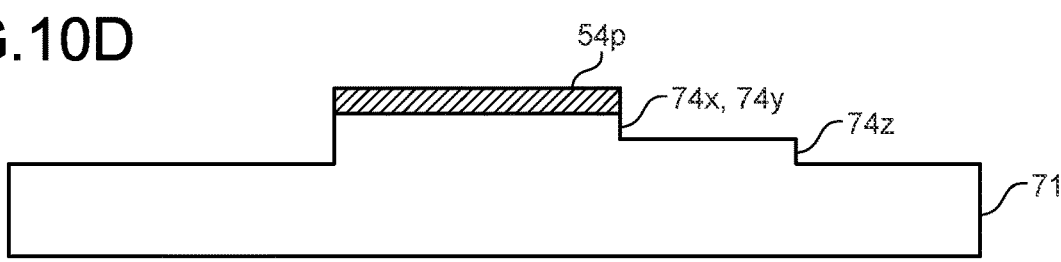

As illustrated in FIG. 10D, the pattern 74z is etched using the mask pattern 54p as a mask to form the pattern 74z having a lower protrusion height than the patterns 74x and 74y. In this process, the resist pattern 65p disappears.

Figure 10E:
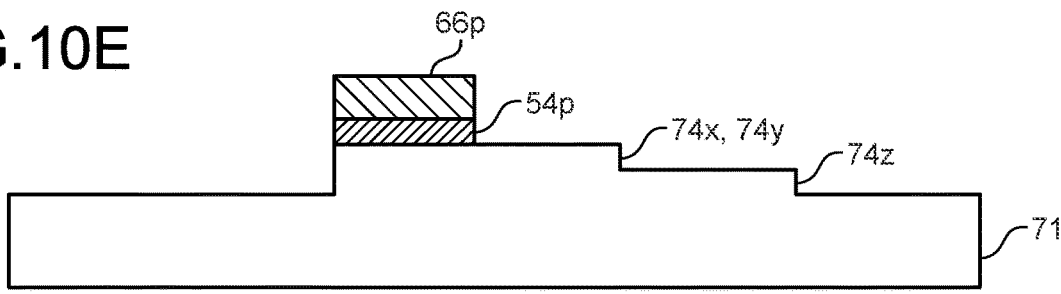

As illustrated in FIG. 10E, a resist pattern 66p is formed on the mask pattern 54p by electron beam drawing or the like. The resist pattern 66p covers a region corresponding to the pattern 74x in the patterns 74x, 74y, and 74z protruding from the substrate 71.

The mask pattern 54p is etched using the resist pattern 66p as a mask to form the mask pattern 54p covering a region corresponding to the pattern 74x similarly to the resist pattern 66p.

Figure 10F:
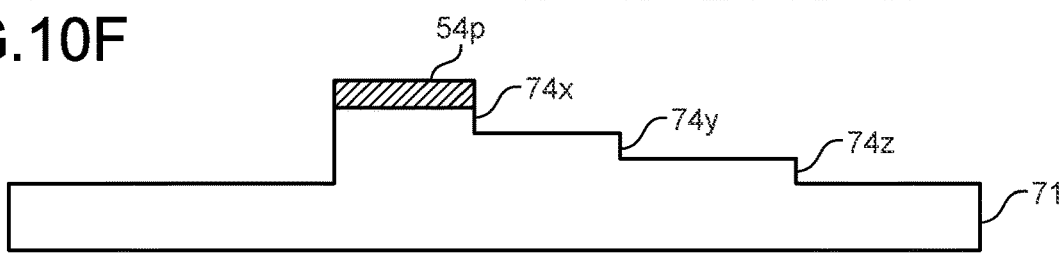

As illustrated in FIG. 10F, the patterns 74y and 74z are etched using the mask pattern 54p as a mask to form the pattern 74y having a lower protrusion height than the pattern 74x and the pattern 74z having a lower protrusion height than the pattern 74y. In this process, the resist pattern 66p disappears.

Thereafter, the remaining mask pattern 54p is removed.

As described above, the step-shaped template 70 is manufactured.

(Configuration Example of Semiconductor Device)

Next, a configuration example of the semiconductor device 20 of the embodiment will be described with reference to FIGS. 11A to 11C. In the semiconductor device 20 of the embodiment, the dual damascene structure 45 is formed using the above-described template 10 of the embodiment.

Figure 11A:
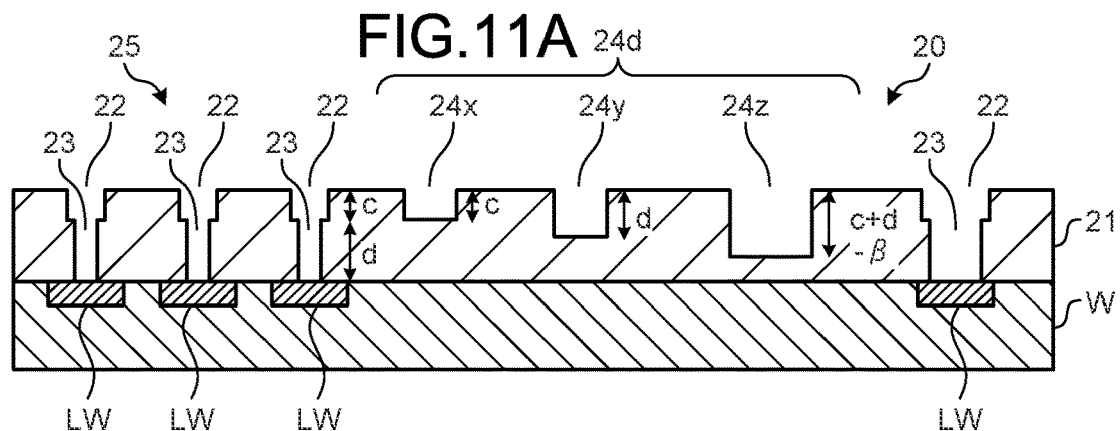
FIGS. 11A to 11C are diagrams illustrating an example of a configuration of a semiconductor device according to the embodiment.
Figure 11B:
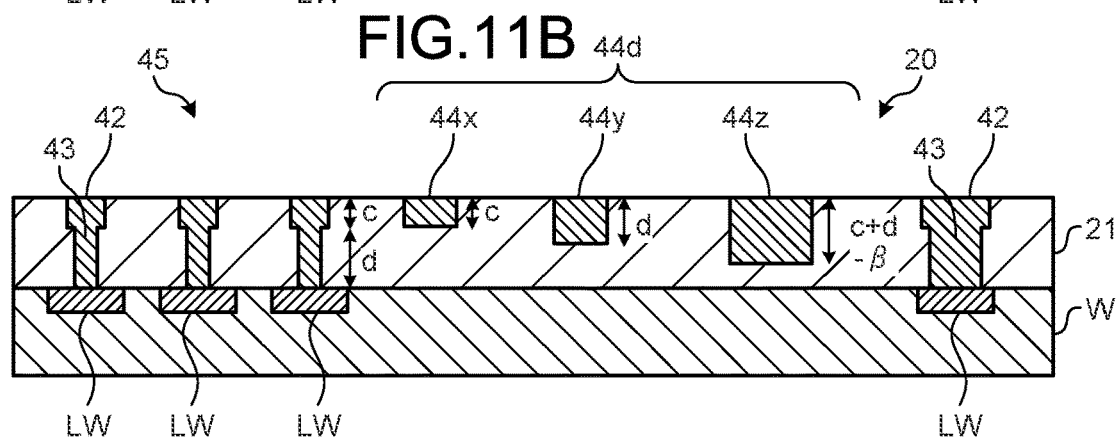
Figure 11C:
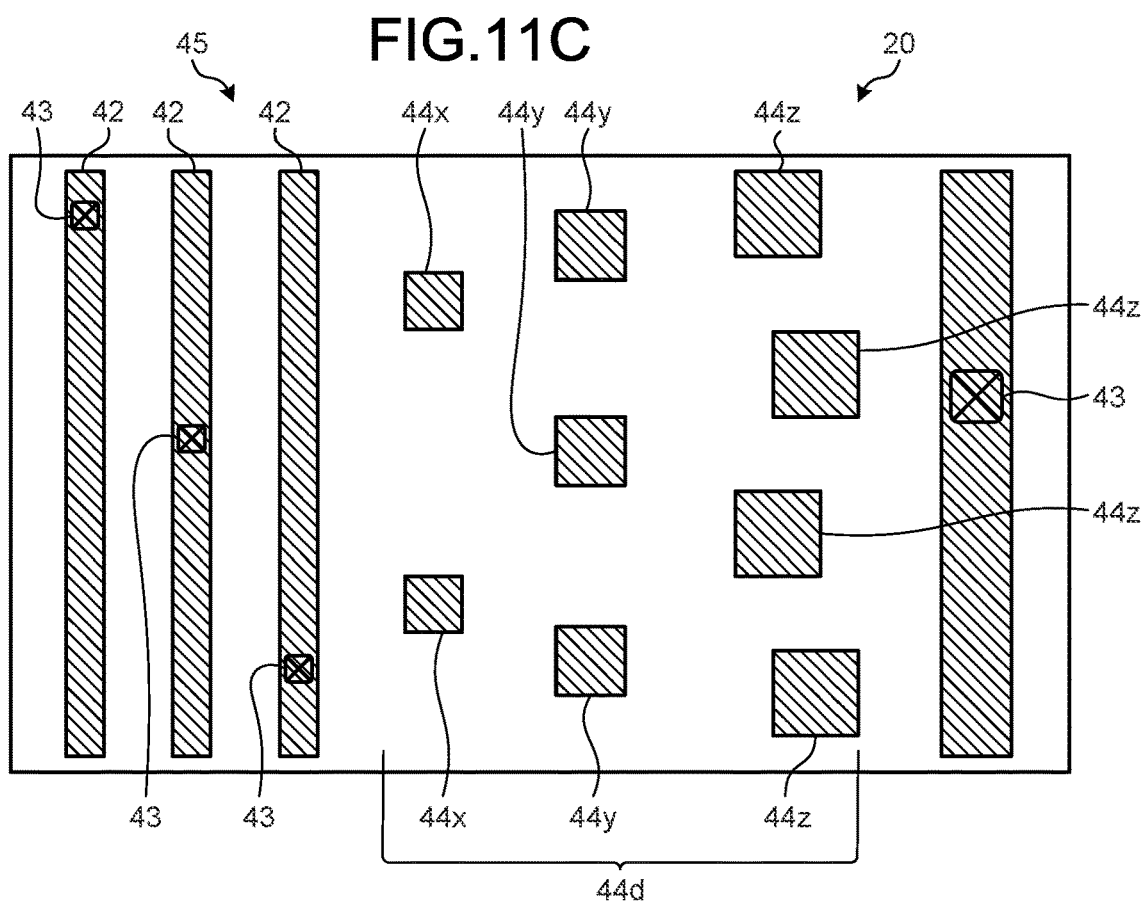

FIGS. 11A to 11C are diagrams illustrating an example of a configuration of the semiconductor device 20 according to the embodiment. FIG. 11A is a cross-sectional view of the semiconductor device 20 in which the recessed pattern 25 and the dummy pattern 24d are formed in the workpiece film 21. FIG. 11B is a cross-sectional view of the semiconductor device 20 in which the dual damascene structure 45 and the dummy 44d are formed. FIG. 11C is a plan view of the semiconductor device 20 in which the dual damascene structure 45 and the dummy 44d are formed.

As illustrated in FIGS. 11A to 11C, the semiconductor device 20 of the embodiment includes the wafer W and the workpiece film 21. Lower layer wiring LW arranged below the dual damascene structure 45 is embedded in the wafer W in a state where an upper surface of the lower layer wiring LW is exposed to a surface of the wafer W. The workpiece film 21 is an insulating film such as an $SiO_2$ film, and is, for example, arranged on the wafer W.

However, another film or a structure constituting a part of the semiconductor device 20 such as a transistor may be interposed between the workpiece film 21 and the wafer W. In this case, the lower layer wiring LW is arranged on a film or the like immediately below the workpiece film 21 in which the dual damascene structure 45 is formed.

Note that, here, a configuration including the wafer W, another film, or the lower layer wiring LW such as the above structure may be referred to as a lower layer structure.

As illustrated in FIG. 11A, the protruding pattern 15 and the dummy portion 14d of the template 10 are transferred. As a result, the recessed pattern 25 and the dummy pattern 24d are formed in the workpiece film 21 of the semiconductor device 20.

The recessed pattern 25 includes the wiring pattern 22 recessed in a depth direction from a surface of the workpiece film 21 and the via pattern 23 extending further downward from a bottom surface of the wiring pattern 22. The dummy pattern 24d includes, for example, dummy patterns 24x, 24y, and 24z recessed in the depth direction from the surface of the workpiece film 21.

The dummy pattern 24x is a pattern to which the dummy portion 14x of the template 10 is transferred, and for example, has a depth substantially equal to the wiring pattern 22 of the workpiece film 21. The dummy pattern 24y is a pattern to which the dummy portion 14y of the template 10 is transferred, and for example, has a depth substantially equal to the single via pattern 23 of the workpiece film 21. That is, the dummy pattern 24y reaches a position deeper than the dummy pattern 24x. The dummy pattern 24z is a pattern to which the dummy portion 14z of the template 10 is transferred, and for example, reaches a position slightly shallower (by length β) than the reach depth of the via pattern 23 including the wiring pattern 22 of the workpiece film 21. That is, the dummy pattern 24z reaches a position further deeper than the dummy pattern 24y.

As illustrated in FIG. 11B, the recessed pattern 25 and the dummy pattern 24d of the semiconductor device 20 are filled with a conductive material to form the dual damascene structure 45 and the dummy 44d.

That is, the semiconductor device 20 of the embodiment includes the wafer W having the lower layer wiring LW and the workpiece film 21 arranged on the wafer W.

The wiring 42 and the via 43 are arranged in the workpiece film 21. The wiring 42 extends in a predetermined direction along an upper surface of the workpiece film 21, and extends in a depth direction of the workpiece film 21 from the upper surface that is one main surface of the workpiece film 21. The via 43 further extends from a bottom surface of the wiring 42 in the depth direction of the workpiece film 21. A bottom of the via 43 is connected to the lower layer wiring LW.

In addition, in the workpiece film 21, the dummy 44d extending from the upper surface of the workpiece film 21 in the depth direction of the workpiece film 21 is arranged. The dummy 44d as a conductive member includes dummies 44x, 44y, and 44z having different reach depths in the workpiece film 21.

The dummy 44x has a bottom surface at substantially the same depth as the wiring 42. The dummy 44y has a bottom surface at a depth position deeper than the wiring 42 and shallower than the via 43 extending further downward from the bottom surface of the wiring 42. That is, the reach depth of the dummy 44y is deeper than the reach depth of the dummy 44x and shallower than the reach depth of the dummy 44z. The dummy 44z has a bottom surface at a position slightly shallower than the via 43 extending further downward from the bottom surface of the wiring 42. Since the reach depth of the dummy 44z is slightly shallower than the via 43 extending downward from the bottom surface of the wiring 42, contact of the dummy 44z with the lower layer wiring LW is suppressed.

Comparative Example

When an imprint process is performed, an organic material such as a resist material is arranged on a wafer by, for example, an inkjet method. In the inkjet method, droplets of a resist material or the like are dropped. In the imprint process, by pressing a template against the droplet-shaped resist material, the resist material spreads in a film shape over an entire lower surface of the template, and a resist pattern covering an entire region to be processed of a workpiece film can be formed. According to the ink jet method, it is easy to cope with a difference in density by increasing the density of the droplets dropped in a dense region and decreasing the density of the droplets dropped in a sparse region.

In place of the inkjet method, a spin coating method has been studied as a method for arranging a resist material on a wafer. In the spin coating method, using a spin coating device or the like, a wafer held on a rotation support table included in the spin coating device is rotated at a high speed, and a resist material is dropped on the wafer. The resist material is applied to the entire wafer by centrifugal force, and a film of the resist material such as a resist film covering the entire surface of the wafer is formed.

For example, when a dual damascene structure having a three-dimensional structure is formed by the imprint process, the volume ratio of the resist film to which the wiring pattern, the via pattern, and the like are transferred in a three-dimensional region is often 50% or more. This is because the volume of the via pattern is relatively smaller than the volume of the wiring pattern, and the wiring pattern includes a line-and-space pattern arranged such that a width ratio between a line and a space is 1:1, an isolated pattern in which no other wiring pattern is present in the periphery, and the like.

In the case described above, it is desirable to use the above-described spin coating method as a method for forming a resist film. By applying a resist material by the spin coating method, time for waiting for the resist material to spread after the template is pressed is reduced. Therefore, throughput of the imprint process can be improved even when the volume ratio of the resist film in the whole is high.

Meanwhile, when the dual damascene structure is formed, a dummy pattern may be arranged. This state is illustrated in FIGS. 12A to 13B.

FIGS. 12A to 12D are schematic diagrams illustrating a method for forming dual damascene structures 45" and 45' according to Comparative Examples 1 and 2.

Figure 12A:
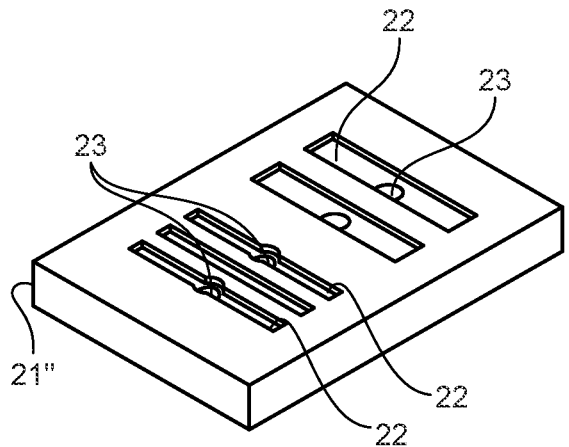
FIGS. 12A to 12D are schematic diagrams illustrating a method for forming a dual damascene structure according to Comparative Examples 1 and 2.
Figure 12B:
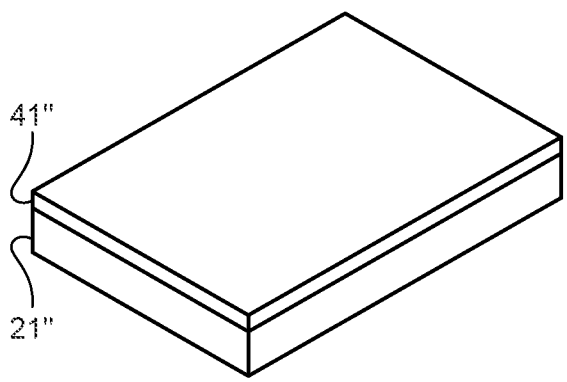
Figure 12C:
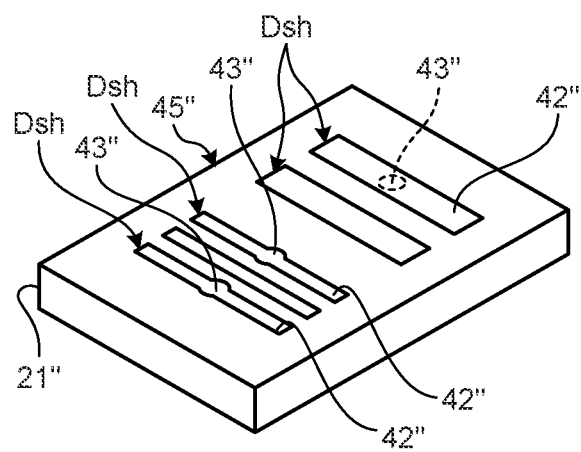

As illustrated in FIG. 12A, a workpiece film 21" of Comparative Example 1 includes only the wiring pattern 22 and the via pattern 23 and does not include a dummy pattern. As illustrated in FIG. 12B, a conductive film 41" is formed so as to cover the workpiece film 21". As illustrated in FIG. 12C, the conductive film 41" on the workpiece film 21" is subjected to CMP polishing to form the dual damascene structure 45" including the wiring 42" and the via 43".

However, a dummy is not arranged in the dual damascene structure 45" of Comparative Example 1. As described above, the workpiece film 21" has a dense region where the wiring pattern 22 is densely arranged like a line-and-space pattern, and a sparse region where the wiring pattern 22 is only sparsely arranged like an isolated pattern. Therefore, due to a difference in a polishing rate between the conductive film 41" and the workpiece film 21", in the sparse region and a region adjacent to the sparse region, the wiring 42" having a dishing shape Dsh with a recessed upper surface may be formed.

Figure 12D:
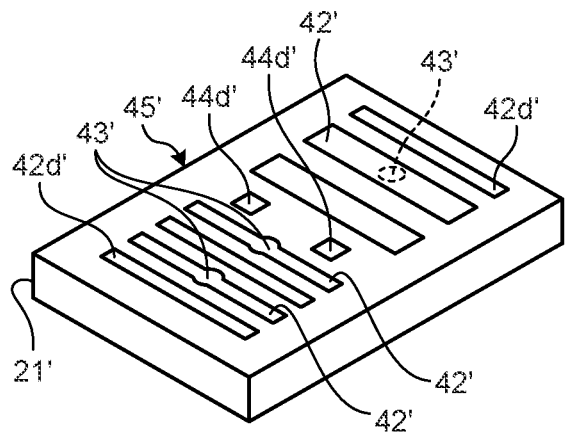

As illustrated in FIG. 12D, the dual damascene structure 45' of Comparative Example 2 includes wiring 42' and a via 43', and dummies 42d' and 44d' are formed in a sparse region of the dual damascene structure 45'. The surface areas of the dummies 42d' and 44d' are adjusted such that the ratio of the surface area of the wiring 42' per unit area in the dense region is equal to that in the sparse region. As a result, formation of the wiring 42' into the dishing shape Dsh is suppressed in the sparse region and a region adjacent to the sparse region.

Figure 13A:
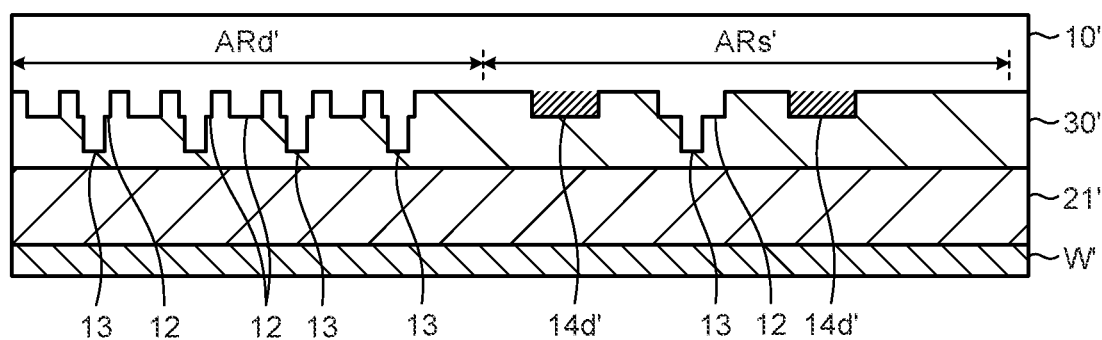
FIGS. 13A and 13B are cross-sectional views illustrating a problem of an imprint process according to Comparative Example 2.
Figure 13B:
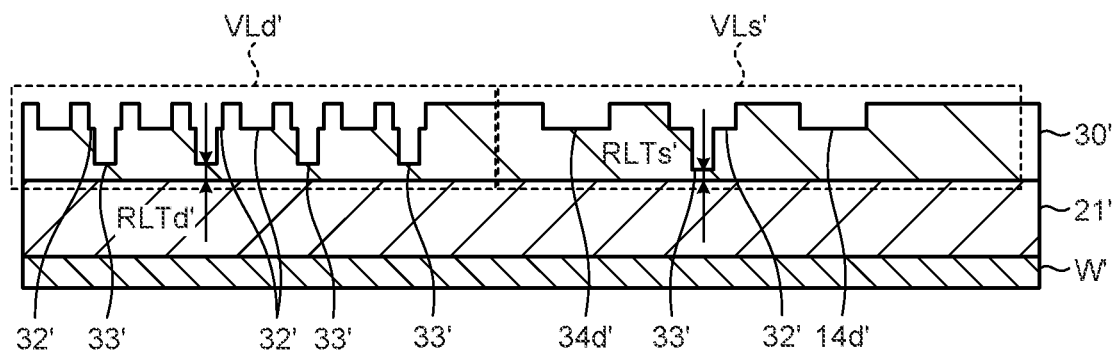

However, the technique of Comparative Example 2 also has a problem. FIGS. 13A and 13B illustrate a problem of Comparative Example 2. FIGS. 13A and 13B are cross-sectional views illustrating a problem of an imprint process according to Comparative Example 2.

As illustrated in FIG. 13A, a template 10' of Comparative Example 2 performs pattern transfer on a resist film 30' in which the workpiece film 21' and the resist film 30' are formed in this order on a wafer W'.

The template 10' has a region where the line portion 12 is densely arranged in a plane thereof and a region where the line portion 12 is sparsely arranged in the plane thereof. In order to reduce a difference in density in the plane of the template 10', a dummy portion 14d' is arranged in a sparse region of the template 10'.

The area of the dummy portion 14d' is adjusted according to an area occupied by the line portion 12 in each of the sparse region and the dense region. As a result, a difference between the area occupied by the line portion 12 in the plane of the dense region of the template 10' and the area occupied by the line portion 12 and the dummy portion 14d' in the plane of the sparse region of the template 10' is within a specified value.

Meanwhile, the height of the dummy portion 14d' does not affect the difference in density in the plane of the template 10', and therefore is not taken into consideration. The dummy portion 14d' is formed, for example, at a height substantially equal to the height of the line portion 12 in order to facilitate manufacturing of the template 10'.

In the resist film 30', a surface facing a surface on which the line portion 12 of the template 10' is densely arranged is referred to as a dense region ARd'. In the resist film 30', a surface facing a surface on which the line portion 12 of the template 10' is sparsely arranged is referred to as a sparse region ARs'. The dummy portion 14d' is further arranged on a surface of the template 10' facing the sparse region ARs' of the resist film 30'.

As a result, after pattern transfer by the template 10', a difference between the area occupied by the resist film 30' in the dense region ARd' and the area occupied by the resist film 30' in the sparse region ARs' can be, for example, within a specified value. Therefore, formation of the wiring 41' to be formed later into a dishing shape is suppressed.

Here, the volume of the resist film 30' including the resist film 30' in a depth direction of the dense region ARd' and the sparse region ARs' is considered.

As illustrated in FIG. 13B, a three-dimensional region including the resist film 30' in the depth direction of the dense region ARd' is referred to as a low volume portion VLd'. The wiring pattern 32' and the via pattern 33' are transferred to the low volume portion VLd'. In addition, a three-dimensional region including the resist film 30' in the depth direction of the sparse region ARs' is referred to as a high volume portion VLs'. In addition to the wiring pattern 32' and the via pattern 33', a dummy pattern 34d' is transferred to the high volume portion VLs'.

As described above, in the template 10' of Comparative Example 2, the dummy portion 14d' is designed without considering a difference in the volume of the resist film 30' between the low volume portion VLd' and the high volume portion VLs'. Therefore, even when the dummy pattern 34d' is transferred to the high volume portion VLs' by the dummy portion 14d', the difference in the volume of the resist film 30' between the low volume portion VLd' and the high volume portion VLs' cannot be sufficiently reduced.

In this flow, in Comparative Example 2, since the difference in the volume of the resist film 30' between the low volume portion VLd' and the high volume portion VLs' remains large, a difference in film thickness between resist residual films RLTd' and RLTs' at a lower end of the via pattern 33' in the low volume portion VLd' and the high volume portion VLs' is generated. That is, the resist residual film RLTd' in the low volume portion VLd' is thick due to an excessive resist material that has not been used for forming the transfer pattern. In addition, the resist residual film RLTs' in the high volume portion VLs' is thin because the amount of the resist material required for forming the transfer pattern is large and an excessive resist material is not generated much.

When the workpiece film 21' is etched to perform pattern transfer on the resist film 30', the resist residual films RLTd' and RLTs' at a lower end of the via pattern 33' are removed in advance by an etch-back process or the like of the resist film 30'. However, when the difference in film thickness between the resist residual films RLTd' and RLTs' is large, for example, the resist residual film RLTd' in the low volume portion VLd' cannot be completely removed, and an etching process of the workpiece film 21' may be inhibited.

According to the design pattern generation method of the embodiment, when the difference in the volume of the resist film 30 per unit area exceeds a specified value, the dummy pattern 34d is added to the high volume portion VLs having a large volume per unit area. In this flow, since the dummy pattern 34d is added in consideration of the difference in the volume of the resist film 30, it is possible to reduce a variation in the resist residual films RLTd and RLTs between the low volume portion VLd and the high volume portion VLs and to suppress inhibition of the etching process of the workpiece film 21.

According to the design pattern generation method of the embodiment, when the dummy pattern 34d is added, the depth of the dummy pattern 34 is adjusted to a depth equal to or more than the depth of the wiring pattern 32 according to the difference in the volume of the resist film 30 per unit area. In this flow, by taking the depth into consideration when the dummy pattern 34d is designed, it is easy to reduce the difference in the volume of the resist film 30 between the low volume portion VLd and the high volume portion VLs.

According to the design pattern generation method of the embodiment, when the dummy pattern 34d is added, the depth of the dummy pattern 34 is adjusted to a depth less than the depth of the via pattern 33 including the depth of the wiring pattern 32 according to the difference in the volume of the resist film 30 per unit area.

In this flow, by taking the depth into consideration when the dummy pattern 34d is designed, it is easy to reduce the difference in the volume of the resist film 30 between the low volume portion VLd and the high volume portion VLs.

In addition, as described above, by designing the dummy pattern 34d at a height at which the dummy pattern 34d does not reach the bottom of the resist film 30, it is possible to suppress the contact of the conductive material filled in the dummy 44d corresponding to the dummy pattern 34d with the lower layer structure.

According to the design pattern generation method of the embodiment, when the dummy pattern 34d is added, the area of the dummy pattern 34d on the transfer surface 30t of the resist film 30 is adjusted according to the difference in the volume of the resist film 30 per unit area. This also reduces the difference in the volume of the resist film 30 between the low volume portion VLd and the high volume portion VLs.

According to the design pattern generation method of the embodiment, when the dummy pattern 34d is added, the number of dummy patterns 34d is adjusted according to the difference in the volume of the resist film 30 per unit area. This also reduces the difference in the volume of the resist film 30 between the low volume portion VLd and the high volume portion VLs.

According to the design pattern generation method of the embodiment, when the difference in the volume of the resist film 30 per unit area exceeds a specified value, the total volume of the wiring pattern 32 and the via pattern 33 in the low volume portion VLd having a small volume per unit area is reduced. This also reduces the difference in the volume of the resist film 30 between the low volume portion VLd and the high volume portion VLs.

According to the design pattern generation method of the embodiment, when the total volume of the wiring pattern 32 and the via pattern 33 in the low volume portion VLd is reduced, the depth of the wiring pattern 32 is adjusted according to the difference in the volume of the resist film 30 per unit area.

In this flow, for example, by adjusting the volume of the wiring pattern 32 in preference to the volume adjustment of the via pattern 33, it is possible to effectively reduce the difference in the volume of the resist film 30 between the low volume portion VLd and the high volume portion VLs.

In addition, by adjusting the depth of the wiring pattern 32 as described above, it is easy to reduce the difference in the volume of the resist film 30 between the low volume portion VLd and the high volume portion VLs.

The template 10 of the embodiment includes the plurality of dummy portions 14x, 14y, and 142 having different heights. This facilitates reduction of the difference in the volume of the resist film 30 between the low volume portion VLd and the high volume portion VLs.

The template 10 of the embodiment includes a plurality of dummy portions having different areas on the contact surface 10c of the template 10. This also makes it possible to reduce the difference in the volume of the resist film 30 between the low volume portion VLd and the high volume portion VLs.

According to the method for manufacturing the template 10 of the embodiment, the resist pattern 63p in which film thicknesses above the plurality of dummy portions 14x, 14y, and 14z are different from one another is formed by an imprint process, the resist pattern 63p is etched back to sequentially expose the plurality of dummy portions 14x, 14y, and 142, and the plurality of dummy portions 14x, 14y, and 14z is sequentially etched back. This makes it possible to form the plurality of dummy portions 14x, 14y, and 14z having different heights.

Modification

Next, a template of a modification of the embodiment will be described with reference to FIGS. 14A to 16C. The template of the modification is different from the above-described template 10 of the embodiment in a manufacturing method.

FIGS. 14A to 16C are cross-sectional views illustrating an example of a procedure of a method for manufacturing the template according to the modification of the embodiment.

Figure 14A:
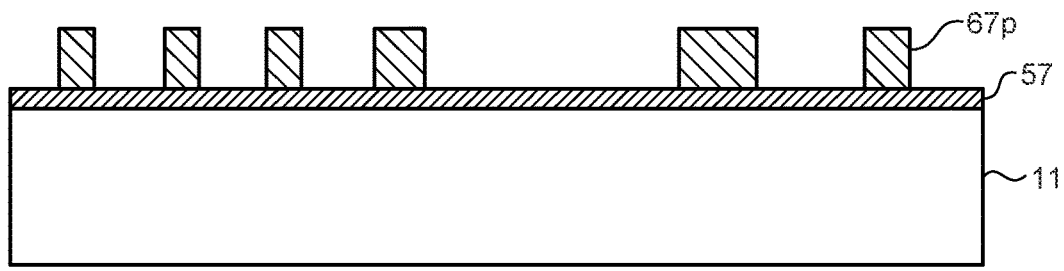
FIGS. 14A to 14E are cross-sectional views illustrating an example of a procedure of a method for manufacturing a template according to a modification of the embodiment.

As illustrated in FIG. 14A a mask film 57 such as a chromium film is formed on an upper surface of the substrate 11 to be a main body of the template of the modification. A resist pattern 67p is formed on the mask film 57 by, for example, electron beam drawing. The resist pattern 67p covers a region where the line portion 12 and the dummy portions 14x and 14Z of the substrate 11 are to be arranged.

Figure 14B:
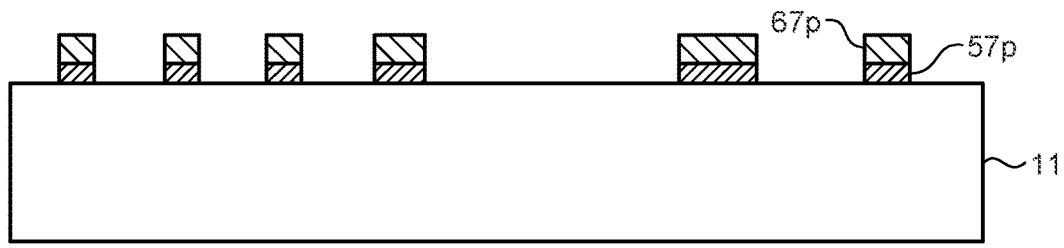

As illustrated in FIG. 14B, the mask film 57 is etched using the resist pattern 67p as a mask to form a mask pattern 57p.

Figure 14C:
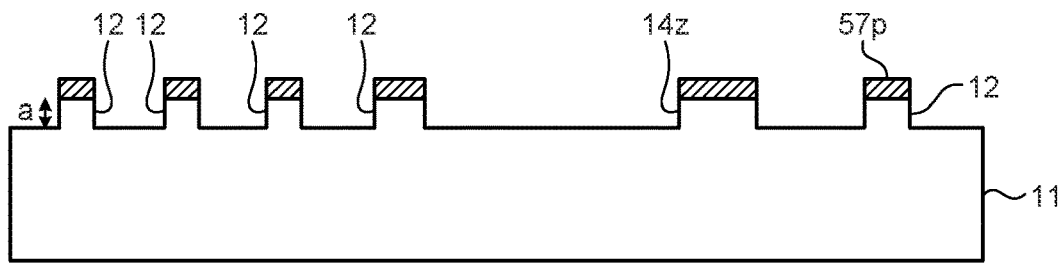

As illustrated in FIG. 14C, the substrate 11 is etched using the mask pattern 57p as a mask to form the line portion 12 and the dummy portions 14x and 14z. At this time, the line portion 12 and the dummy portions 14x and 14z have a substantially equal height. The protrusion height of the line portion 12 and the dummy portions 14x and 14z from the substrate 11 is, for example, substantially equal to the height of the line portion 12 finally included in the template of the modification.

Note that in the above process, the resist pattern 67p disappears.

Figure 14D:
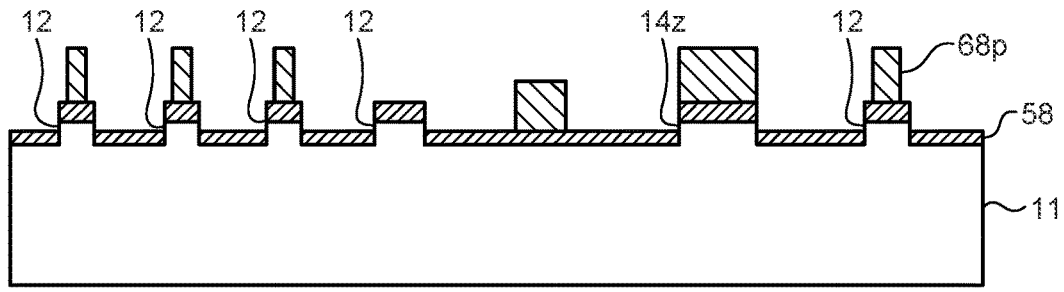

As illustrated in FIG. 14D, after the mask pattern 57p is removed, a mask film 58 such as a chromium film covering the entire surface of the substrate 11 is formed. A resist pattern 68p is formed on the mask film 58 by, for example, electron beam drawing. The resist pattern 68p covers a region where the columnar portion 13 and the dummy portions 14y and 14z of the substrate 11 are to be arranged.

Figure 14E:
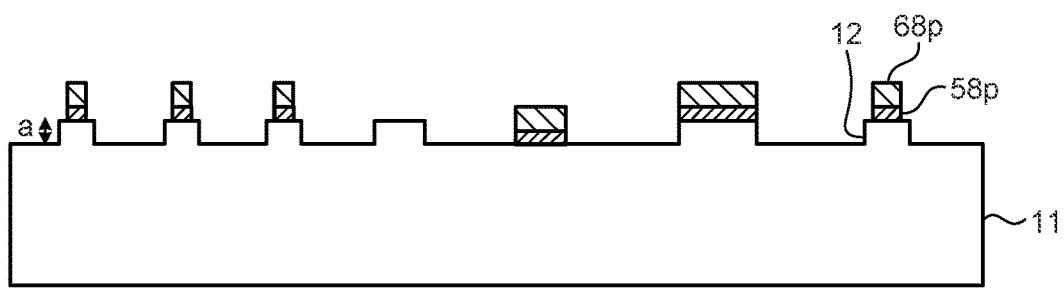

As illustrated in FIG. 14E, the mask film 58 is etched using the resist pattern 68p as a mask to form a mask pattern 58p.

Figure 15A:
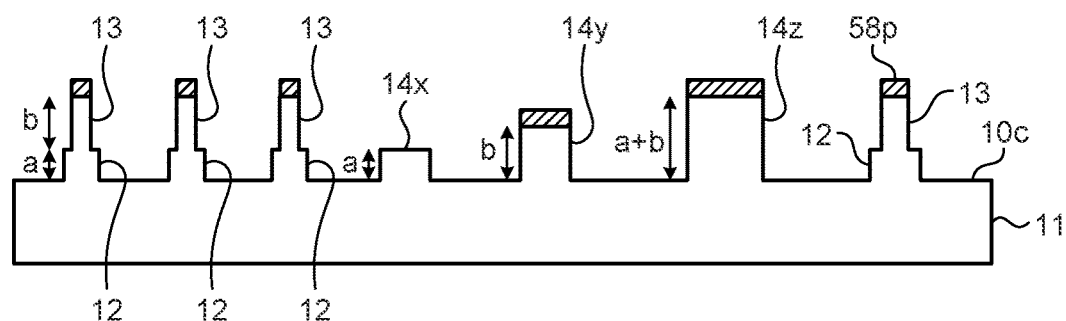
FIGS. 15A to 15C are cross-sectional views illustrating an example of the procedure of the method for manufacturing a template according to the modification of the embodiment.

As illustrated in FIG. 15A, the substrate 11 to be a main body of the template of the modification is processed to expose the contact surface 10c to be in contact with the resist film 30. In addition, the line portion 12 protruding from the contact surface 10c of the substrate 11, the columnar portion 13 arranged on an upper surface of the line portion 12, and the dummy portion 14z having a height substantially equal to the height of the columnar portion 13 on the line portion 12 are formed.

That is, the substrate 11 is etched using the mask pattern 58p as a mask to expose the contact surface 10c of the substrate 11.

As a result, for example, the line portion 12 and the dummy portion 14x are dug down by the same height as the columnar portion 13 finally included in the template of the modification and protrude from the contact surface 10c of the substrate 11. In addition, the columnar portion 13 having the final height of the columnar portion 13 is formed on an upper surface of the line portion 12.

In addition, the dummy portion 14y is formed so as to protrude from the contact surface 10c of the substrate 11 at a height substantially equal to the height of the columnar portion 13 not including the line portion 12. In addition, the dummy portion 14z protrudes from the contact surface 10c of the substrate 11 at a height substantially equal to the protrusion height of the columnar portion 13 from the substrate 11.

Note that when the line portion 12, the columnar portion 13, and the dummy portions 14x, 14y, and 14z are formed, a plurality of dummy portions 14x, 14y, and 14z having different areas on the contact surface 10c of the substrate 11 may be formed.

In the above process, the resist pattern 68p disappears.

As illustrated in FIGS. 15B to 16A, a resist pattern 63p which covers the line portion 12, the columnar portion 13, and the dummy portions 14x, 14y, and 14z and in which a film thickness above the dummy portions 14x, 14y, and 14z is smaller than a film thickness above the line portion 12 and the columnar portion 13 is formed by an imprint process. The processes of FIGS. 15B to 16A will be described in detail below.

Figure 15B:
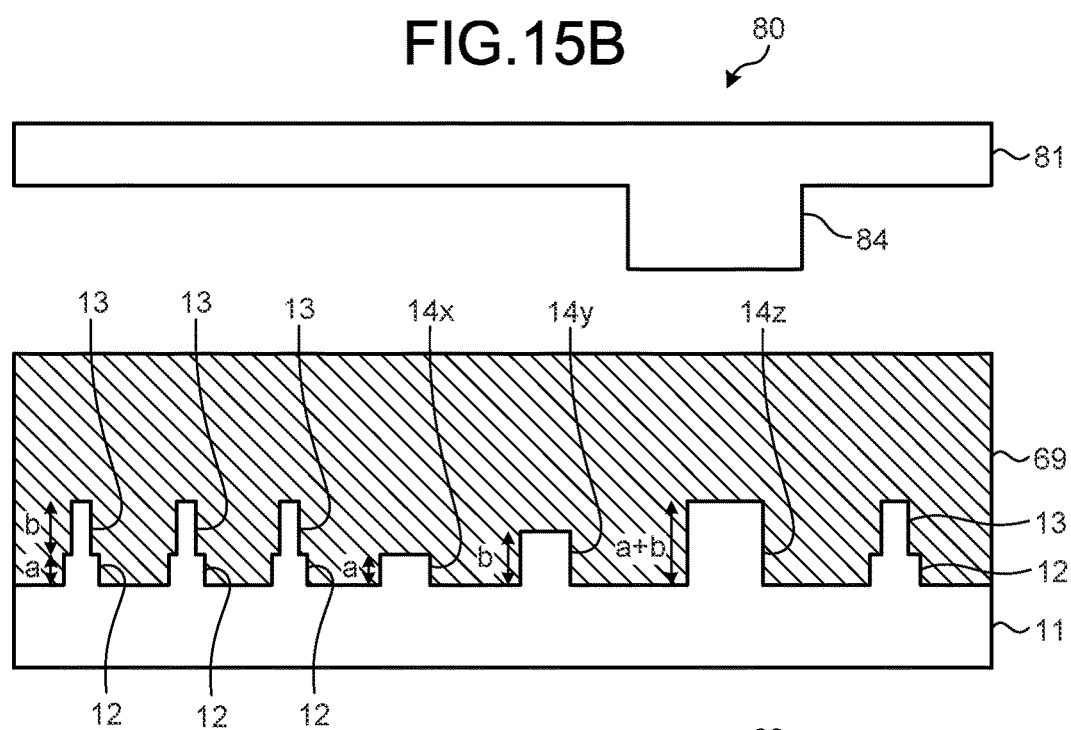

As illustrated in FIG. 15B, after the mask pattern 58p is removed, a resist film 69 covering the entire surface of the substrate 11 is formed by, for example, spin coating. As a result, the whole of the line portion 12, the columnar portion 13, and the dummy portions 14x, 14y, and 14z on the substrate 11 is covered with the resist film 69 having a substantially flat upper surface.

In addition, a template 80 having a pattern 84 is arranged above the substrate 11 such that the pattern 84 faces the substrate 11. More specifically, when the template 80 is arranged above the substrate 11, the pattern 84 is arranged at a position above the dummy portion 14z.

Here, a substrate 81 of the template 80 is made of a material transparent to ultraviolet light, such as quartz. The pattern 84 of the template 80 protrudes from the substrate 81 constituting a main body of the template 80.

Figure 15C:
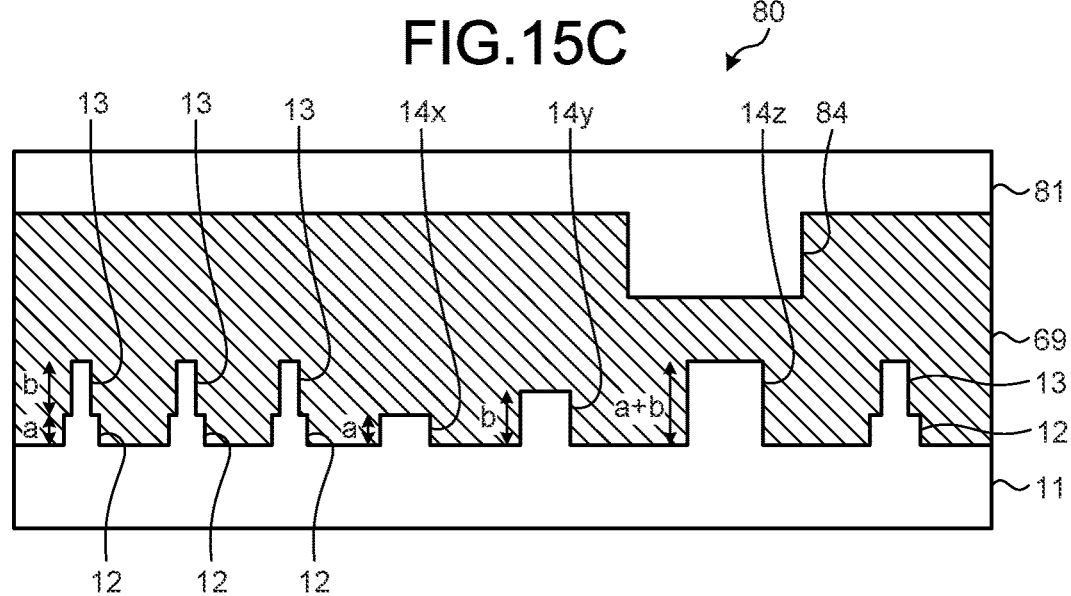

As illustrated in FIG. 15C, the pattern 84 of the template 80 is pressed against the resist film 69 on the substrate 11, and ultraviolet light is emitted from above the template 80 to transfer the pattern 84 to the resist film 69.

Figure 16A:
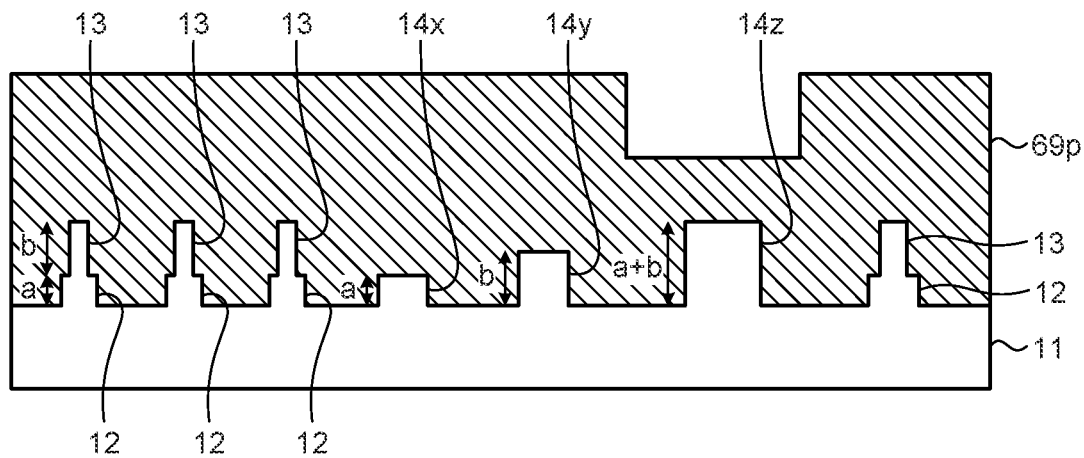
FIGS. 16A to 16C are cross-sectional views illustrating an example of the procedure of the method for manufacturing a template according to the modification of the embodiment.

As illustrated in FIG. 16A, the pattern 84 is transferred to the resist film 69 to form a resist pattern 69p. The film thickness of the resist pattern 69p above the dummy portion 14z is smaller than, for example, that of the resist pattern 69p above the line portion 12, the columnar portion 13, and the other dummy portions 14x and 14y.

Figure 16B:
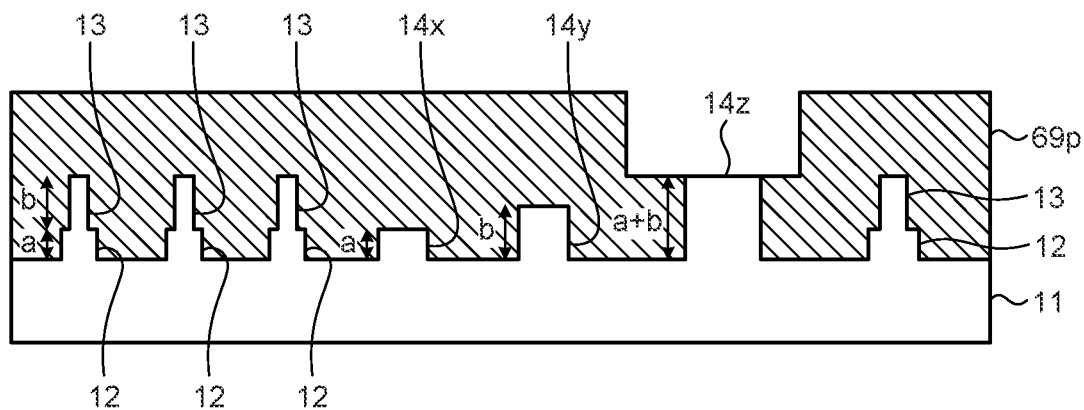
Figure 16C:
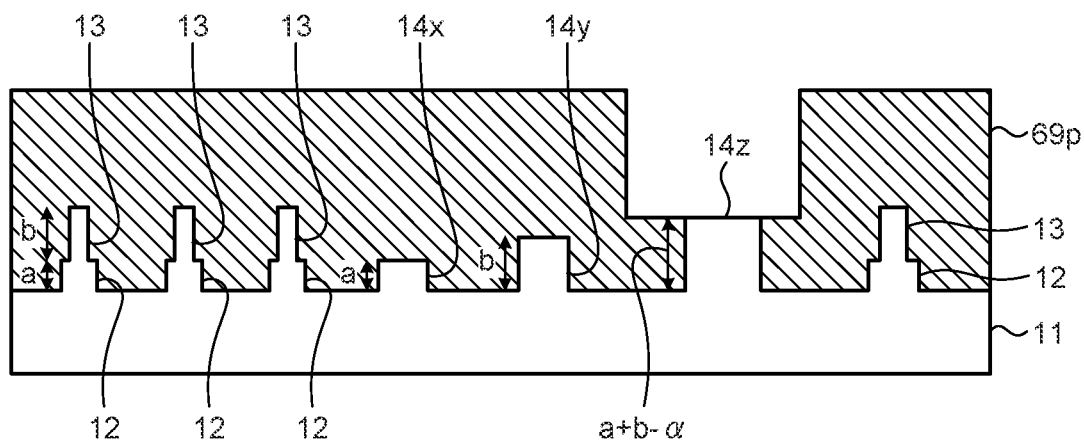

As illustrated in FIGS. 16B and 16C, the resist pattern 69p is etched back to expose the dummy portion 14z to a surface of the resist pattern 69p. In addition, the exposed dummy portions 14z is further etched back to form the dummy portion 14z having a height less than the height of the columnar portion 13 on the line portion 12. The processes of FIGS. 16B and 16C will be described in detail below.

As illustrated in FIG. 16B, the resist pattern 69p is etched back. As a result, an upper end of the dummy portion 14z is exposed to an upper surface of the resist pattern 69p.

As illustrated in FIG. 16C, the resist pattern 69p is further continuously etched back. At this time, by using an etch-back condition capable of etching not only the resist pattern 69p but also the dummy portion 14z made of quartz or the like, the upper end of the dummy portion 14z exposed to the upper surface of the resist pattern 69p is also etched.

As described above, the dummy portion 14x having a substantially equal height to the line portion 12, the dummy portion 14y having a substantially equal height to the columnar portion 13 not including the line portion 12, and the dummy portion 14z having a slightly lower height than the columnar portion 13 including the line portion 12 are formed on the contact surface 10c of the substrate 11.

Thereafter, the remaining resist pattern 69p is removed by an ashing process using oxygen plasma or the like.

As described above, the template of the modification is manufactured.

Notes

Hereinafter, preferred embodiments of the present invention will be noted.

(Note 1)

According to one aspect of the present invention, there is provided a semiconductor device including:

a lower layer structure having lower layer wiring;

an insulating film arranged on the lower layer structure;

wiring extending in a predetermined direction along the insulating film and extending from one main surface of the insulating film in a depth direction of the insulating film;

a via further extending from a bottom surface of the wiring in the depth direction of the insulating film and connected to the lower layer wiring; and a conductive material extending from the main surface of the insulating film in the depth direction of the insulating film, and having a bottom surface at a depth position deeper than the wiring and shallower than the via extending further downward from the bottom surface of the wiring.

(Note 2)

The semiconductor device according to note 1, wherein the conductive member includes a plurality of conductive members, and at least one of a depth and an area is different among the plurality of conductive members, the depth being a depth in the insulating film from the main surface, the area being an area on the main surface of the insulating film.

(Note 3)

The semiconductor device according to note 1, wherein the conductive member is in an electrically floating state.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A design pattern generation method for generating a design pattern of a template comprising:

generating an actual pattern including a first pattern protruding from a contact surface of the template with a material layer and extending in a predetermined direction along the contact surface, and a second pattern further protruding from an upper surface of the first pattern;

calculating a volume of the first pattern and the second pattern per unit area on the contact surface; and adding, when a difference in the volume of the first pattern and the second pattern per the unit area between regions on the contact surface exceeds a specified value, a third pattern to a region where the volume of the first pattern and the second pattern per the unit area is small, wherein when the third pattern is added, a height of the third pattern from the contact surface is adjusted to a height equal to or more than a height of the first pattern from the contact surface and less than a height of the second pattern from the contact surface according to the difference in the volume of the first pattern and the second pattern per the unit area.

2. The design pattern generation method according to claim 1, wherein when the third pattern is added, an area of the third pattern on the contact surface is adjusted according to the difference in the volume of the first pattern and the second pattern per the unit area.

3. The design pattern generation method according to claim 1, wherein when the third pattern is added, a number of the third patterns is adjusted according to the difference in the volume of the first pattern and the second pattern per the unit area.

4. The design pattern generation method according to claim 1, further comprising:

when the difference in the volume of the first pattern and the second pattern per the unit area exceeds the specified value, reducing a total volume of the first pattern and the second pattern in a region where the volume of the first pattern and the second pattern per the unit area is large.

5. The design pattern generation method according to claim 4, wherein when the total volume is reduced, a height of the first pattern is adjusted according to the difference in the volume of the first pattern and the second pattern per the unit area.

6. The design pattern generation method according to claim 1, wherein the first pattern is a line pattern, the second pattern is a columnar pattern, and the third pattern is a dummy pattern.

7. A design pattern generation method for generating a design pattern of a template comprising:

generating an actual pattern including a first pattern protruding from a contact surface of the template with a material layer and extending in a predetermined direction along the contact surface, and a second pattern further protruding from an upper surface of the first pattern;

calculating a volume of the first pattern and the second pattern per unit area on the contact surface;

adding, when a difference in the volume of the first pattern and the second pattern per the unit area between regions on the contact surface exceeds a specified value, a third pattern to a region where the volume of the first pattern and the second pattern per the unit area is small; and when the difference in the volume of the first pattern and the second pattern per the unit area exceeds the specified value, reducing a total volume of the first pattern and the second pattern in a region where the volume of the first pattern and the second pattern per the unit area is large, wherein when the total volume is reduced, a height of the first pattern is adjusted according to the difference in the volume of the first pattern and the second pattern per the unit area.

* * * * *